US012066905B2

(12) United States Patent
Jung et al.

(10) Patent No.: US 12,066,905 B2
(45) Date of Patent: Aug. 20, 2024

(54) STORAGE DEVICE, OPERATING METHOD OF STORAGE DEVICE, AND ELECTRONIC DEVICE INCLUDING STORAGE DEVICE

(71) Applicant: SAMSUNG ELECTRONICS CO., LTD., Suwon-si (KR)

(72) Inventors: Sangwon Jung, Busan (KR); Mincheol Kwon, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 258 days.

(21) Appl. No.: 17/511,752

(22) Filed: Oct. 27, 2021

(65) Prior Publication Data

US 2022/0283912 A1 Sep. 8, 2022

(30) Foreign Application Priority Data

Mar. 3, 2021 (KR) .................. 10-2021-0028321

(51) Int. Cl.
*G06F 11/00* (2006.01)
*G06F 11/16* (2006.01)
*G06F 12/02* (2006.01)
*G06F 13/16* (2006.01)

(52) U.S. Cl.
CPC ...... *G06F 11/1658* (2013.01); *G06F 12/0246* (2013.01); *G06F 13/161* (2013.01)

(58) Field of Classification Search
CPC .................................................. G06F 11/1658
USPC ........................................................ 714/1–57
See application file for complete search history.

(56) References Cited

U.S. PATENT DOCUMENTS

| 8,001,356 | B2 | 8/2011 | Im et al. | |
|---|---|---|---|---|
| 8,601,312 | B2 | 12/2013 | Daikokuya et al. | |
| 8,832,507 | B2 | 9/2014 | Post et al. | |
| 8,924,832 | B1* | 12/2014 | Lam | G06F 3/0619 |
| | | | | 711/202 |
| 9,760,482 | B2 | 9/2017 | Hashimoto | |
| 10,095,418 | B1 | 10/2018 | Gong et al. | |
| 10,540,274 | B2 | 1/2020 | Szubbocsev | |
| 2002/0108075 | A1* | 8/2002 | Zilberman | G11C 29/44 |
| | | | | 714/29 |
| 2002/0188814 | A1* | 12/2002 | Saito | G06F 12/0246 |
| | | | | 711/159 |
| 2007/0168724 | A1* | 7/2007 | Kohiga | G06F 9/4418 |
| | | | | 714/23 |

(Continued)

FOREIGN PATENT DOCUMENTS

| JP | 4636005 B2 | 2/2011 |
|---|---|---|
| JP | 5782556 B2 | 9/2015 |
| KR | 10-2143086 B1 | 8/2020 |

*Primary Examiner* — Sarai E Butler
(74) *Attorney, Agent, or Firm* — Fish & Richardson P.C.

(57) ABSTRACT

Disclosed is an operating method of a storage device which includes a plurality of nonvolatile memory chips. The method includes providing, at the storage device, information of a capacity of each of the plurality of nonvolatile memory chips to an external host device, receiving, at the storage device, information of a plurality of groups from the external host device, performing a reset after receiving the information of the plurality of groups, mapping, at the storage device, the plurality of nonvolatile memory chips with the plurality of groups, and configuring the plurality of nonvolatile memory chips so as to correspond to the plurality of groups, after performing the reset.

20 Claims, 16 Drawing Sheets

(56) References Cited

U.S. PATENT DOCUMENTS

| | | | |
|---|---|---|---|
| 2010/0082893 A1* | 4/2010 | Ma | G06F 21/78 |
| | | | 711/E12.016 |
| 2010/0241798 A1* | 9/2010 | Wong | G06F 12/0246 |
| | | | 713/1 |
| 2011/0078363 A1* | 3/2011 | Yeh | G06F 12/0246 |
| | | | 711/E12.001 |
| 2011/0202791 A1* | 8/2011 | Saitou | G06F 11/2089 |
| | | | 711/E12.002 |
| 2012/0017053 A1 | 1/2012 | Yang et al. | |
| 2012/0151158 A1* | 6/2012 | Yeh | G06F 12/0246 |
| | | | 711/E12.001 |
| 2013/0067187 A1* | 3/2013 | Moss | G06F 3/0644 |
| | | | 711/170 |
| 2015/0089287 A1* | 3/2015 | Jayakumar | G06F 12/0802 |
| | | | 714/39 |
| 2016/0162208 A1* | 6/2016 | Cai | G06F 11/1016 |
| | | | 711/103 |
| 2016/0232088 A1* | 8/2016 | Mohan | G06F 12/0246 |
| 2017/0075620 A1* | 3/2017 | Yamamoto | G06F 12/0866 |
| 2019/0332262 A1* | 10/2019 | Prasad | G06F 3/0679 |
| 2020/0117533 A1* | 4/2020 | Nijhawan | G11C 5/04 |
| 2020/0192592 A1 | 6/2020 | Song et al. | |

* cited by examiner

STORAGE DEVICE, OPERATING METHOD OF STORAGE DEVICE, AND ELECTRONIC DEVICE INCLUDING STORAGE DEVICE

CROSS-REFERENCE TO RELATED APPLICATION

This application claims priority under 35 U.S.C. § 119 to Korean Patent Application No. 10-2021-0028321 filed on Mar. 3, 2021, in the Korean Intellectual Property Office, the disclosure of which is incorporated by reference herein in its entirety.

BACKGROUND

1. Field

Embodiments relate to an electronic device, an operating method of the storage device, and an electronic device including the storage device.

2. Description of the Related Art

A storage device may include nonvolatile memory chips, and may store data in the nonvolatile memory chips. The nonvolatile memory chips may include various memory chips such as flash memory chips, magnetic memory chips, phase change memory chips, and resistive memory chips.

SUMMARY

According to an embodiment, an operating method of a storage device which includes a plurality of nonvolatile memory chips includes providing, at the storage device, information of a capacity of each of the plurality of nonvolatile memory chips to an external host device, receiving, at the storage device, information of a plurality of groups from the external host device, performing a reset after receiving the information of the plurality of groups, mapping, at the storage device, the plurality of nonvolatile memory chips with the plurality of groups, and configuring the plurality of nonvolatile memory chips so as to correspond to the plurality of groups, after performing the reset.

According to an embodiment, a storage device includes a plurality of nonvolatile memory chips, and a memory controller that receives information of a plurality of groups from an external host device and maps at least one nonvolatile memory chip of the plurality of nonvolatile memory chips with each of the plurality of groups. In response to that an access request for one group of the plurality of groups is received from the external host device, the memory controller accesses at least one nonvolatile memory chip corresponding to the one group from among the plurality of nonvolatile memory chips.

According to an embodiment, an electronic device includes a central processing unit, a random access memory that is used as a working memory by the central processing unit, and a storage device that stores original data of data loaded onto the random access memory by the central processing unit and to store data generated by the central processing unit. The storage device includes a plurality of nonvolatile memory chips, and a memory controller that receives information of a plurality of groups from the central processing unit and maps at least one nonvolatile memory chip of the plurality of nonvolatile memory chips with each of the plurality of groups. In response to that an access request for one group of the plurality of groups is received from the central processing unit, the memory controller accesses at least one nonvolatile memory chip corresponding to the one group from among the plurality of nonvolatile memory chips. Based on that a fail occurs in at least one nonvolatile memory chip of the plurality of nonvolatile memory chips, the memory controller updates mapping between the plurality of groups and the plurality of nonvolatile memory chips.

BRIEF DESCRIPTION OF THE FIGURES

Features will become apparent to those of skill in the art by describing in detail example embodiments with reference to the attached drawings in which.

DETAILED DESCRIPTION

Figure 1:
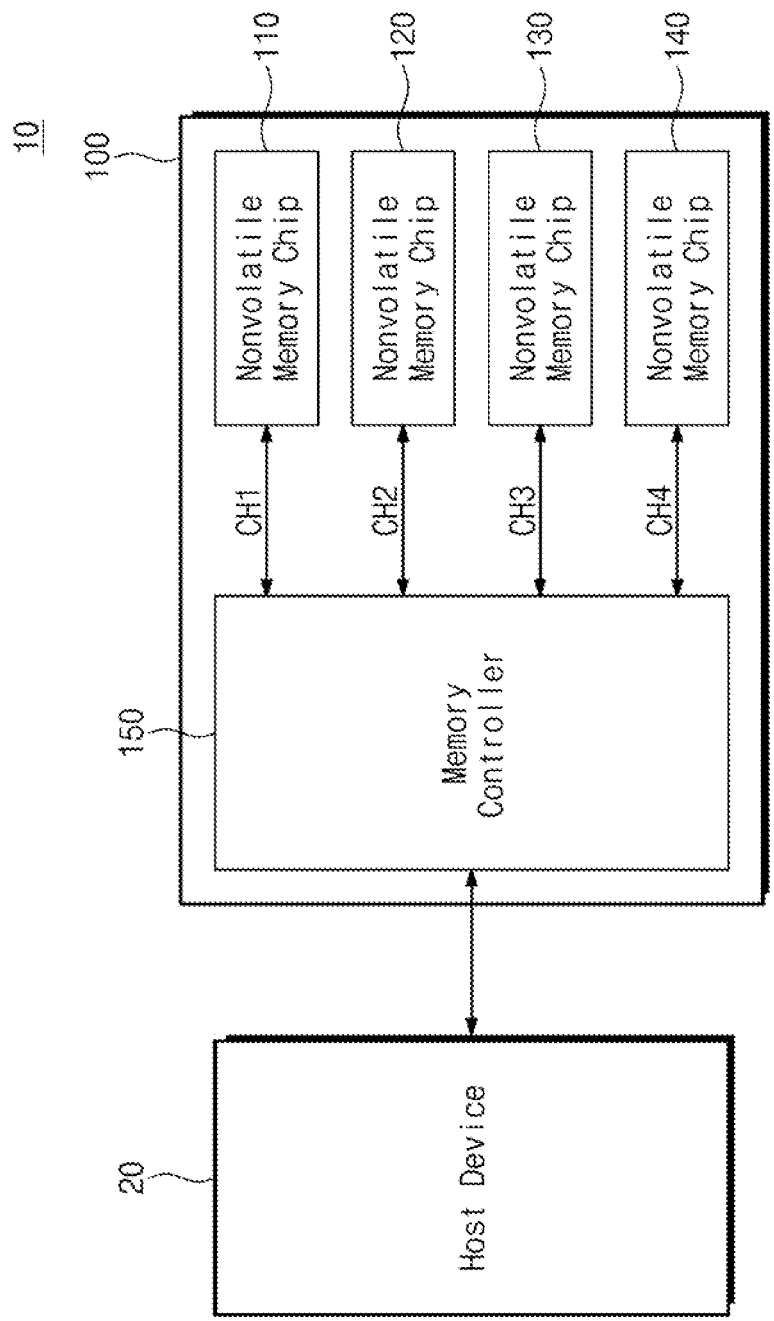
FIG. 1 illustrates an electronic device according to a first example embodiment.

FIG. 1 illustrates an electronic device 10 according to a first embodiment.

Referring to FIG. 1, the electronic device 10 may include a storage device 100 and a host device 20, which may be, e.g., an external host device. The storage device 100 may perform a write, read, or erase operation in response to a write, read, or erase request of the host device 20.

The storage device 100 may include, e.g., first to fourth nonvolatile memory chips 110, 120, 130, and 140, and a memory controller 150.

The first to fourth nonvolatile memory chips 110, 120, 130, and 140 may include various memory chips such as flash memory chips, ferroelectric memory chips, magnetic memory chips, phase change memory chips, and resistive memory chips. The first to fourth nonvolatile memory chips 110, 120, 130, and 140 may include the same type of memory chips or different types of memory chips. The first to fourth nonvolatile memory chips 110, 120, 130, and 140 may have the same capacity or different capacities. The first to fourth nonvolatile memory chips 110, 120, 130, and 140 may operate based on the same structure or different structures.

The memory controller 150 may access the first nonvolatile memory chip 110 through a first channel CH1. The memory controller 150 may access the second nonvolatile memory chip 120 through a second channel CH2. The memory controller 150 may access the third nonvolatile memory chip 130 through a third channel CH3. The memory controller 150 may access the fourth nonvolatile memory chip 140 through a fourth channel CH4.

The memory controller 150 may access the first to fourth nonvolatile memory chips 110, 120, 130, and 140 in response to an access request of the host device 20. The access request may include a write request, a read request, or an erase request. The access to the first to fourth nonvolatile memory chips 110, 120, 130, and 140 may include a write operation, a read operation, and an erase operation.

The memory controller 150 may control the storage device 100 in an integration mode or an individual mode in response to a request of the host device 20. In the integration mode, the memory controller 150 may integrate storage spaces of the first to fourth nonvolatile memory chips 110, 120, 130, and 140 so as to be provided to the host device 20. In the individual mode, the memory controller 150 may individually, e.g., respectively, provide the storage spaces of the first to fourth nonvolatile memory chips 110, 120, 130, and 140 to the host device 20.

The memory controller 150 may communicate with the host device 20 through one channel or through two or more independent channels. The two or more independent channels may be called lanes or any other name defined by the communication protocol. An example where one nonvolatile memory chip communicates with the memory controller 150 through one channel is illustrated in FIG. 1. However, two or more nonvolatile memory chips may share one channel and may communicate with the memory controller 150. Alternatively, two or more nonvolatile memory chips may be connected with one channel.

An example where the storage device 100 includes 4 nonvolatile memory chips and 4 channels is illustrated in FIG. 1. However, in the storage device 100, the number of nonvolatile memory chips and the number of channels between nonvolatile memory chips and a memory controller may be varied.

Figure 2:
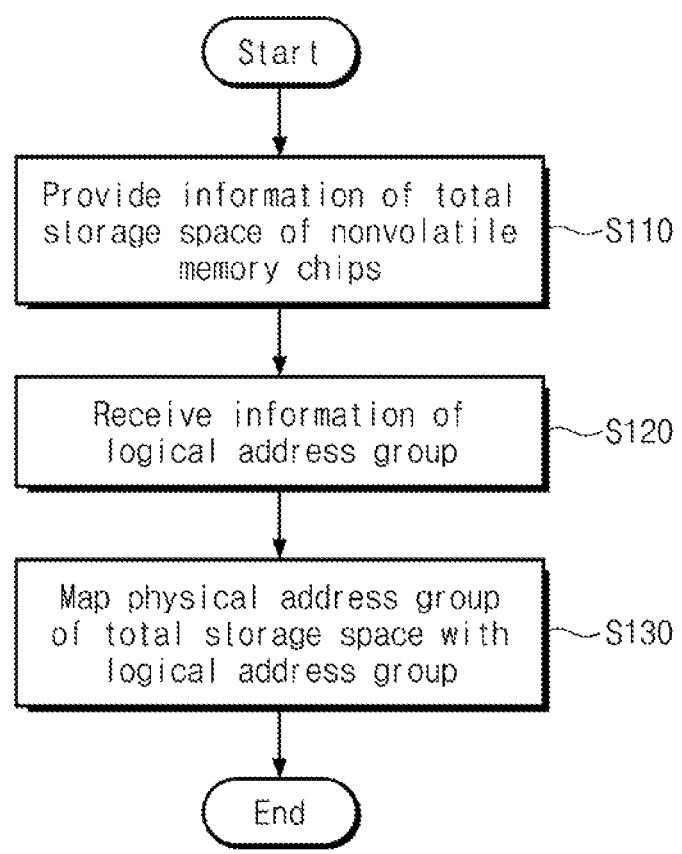
FIG. 2 illustrates an example in which a storage device and a host device set a storage space in an integration mode.

FIG. 2 illustrates an example in which the storage device 100 and the host device 20 set a storage space in an integration mode.

Referring to FIGS. 1 and 2, in operation S110, the storage device 100 may provide information of a total storage space of the first to fourth nonvolatile memory chips 110, 120, 130, and 140 to the host device 20. For example, the storage device 100 may provide the host device 20 with information of a total storage space specified to be provided to the host device 20 from among the storage spaces of the first to fourth nonvolatile memory chips 110, 120, 130, and 140.

In operation S120, the storage device 100 may receive information of a logical address group from the host device 20. The host device 20 may allocate logical addresses, e.g., continuous logical addresses, to the storage device 100, based on the information of the total storage space. The host device 20 may provide the storage device 100 with the information of the logical address group including the continuous logical addresses.

In operation S130, the storage device 100 may map a physical address group of the total storage space of the first to fourth nonvolatile memory chips 110, 120, 130, and 140 to the logical address group allocated by the host device 20.

Figure 3:
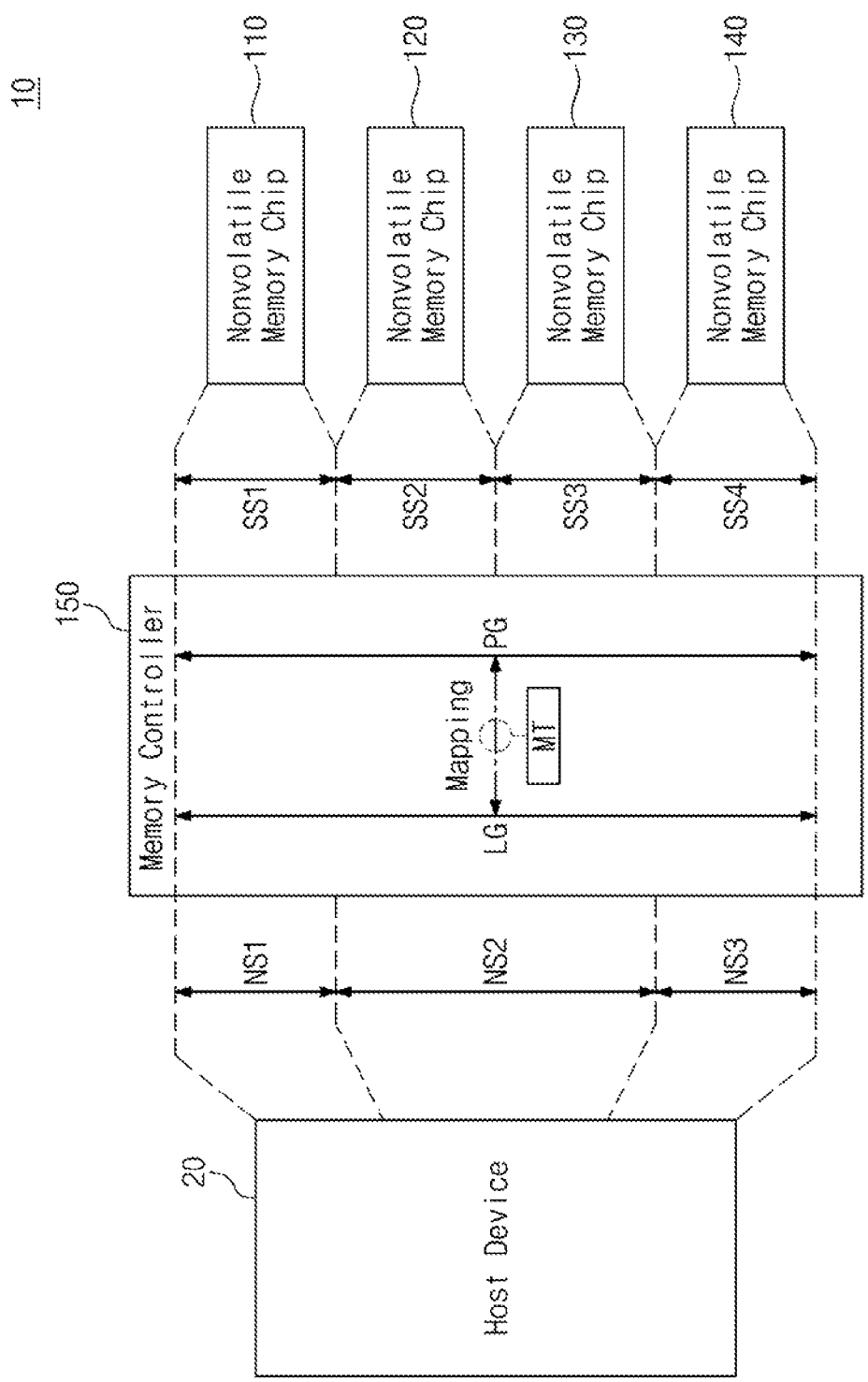
FIG. 3 illustrates an example in which a memory controller provides a host device with storage spaces of first to fourth nonvolatile memory chips based on a process of FIG. 2, in an integration mode.

FIG. 3 illustrates an example in which the memory controller 150 provides the host device 20 with storage spaces of the first to fourth nonvolatile memory chips 110, 120, 130, and 140 based on the process of FIG. 2, in the integration mode.

Referring to FIGS. 1 and 3, the first nonvolatile memory chip 110 may provide a storage space corresponding to a first storage space SS1 to the host device 20 through the memory controller 150. The second nonvolatile memory chip 120 may provide a storage space corresponding to a second storage space SS2 to the host device 20 through the memory controller 150. The third nonvolatile memory chip 130 may provide a storage space corresponding to a third storage space SS3 to the host device 20 through the memory controller 150. The fourth nonvolatile memory chip 140 may provide a storage space corresponding to a fourth storage space SS4 to the host device 20 through the memory controller 150.

In an example embodiment, the first to fourth storage spaces SS1, SS2, SS3, and SS4 may be storage spaces provided to the host device 20 from among storage spaces of the first to fourth nonvolatile memory chips 110, 120, 130, and 140. The storage spaces provided to the host device 20 may be specified such that a part of real storage spaces of the first to fourth nonvolatile memory chips 110, 120, 130, and 140 is provided to the host device 20, for example.

For example, the memory controller 150 may use a part of a storage space of each or at least one of the first to fourth nonvolatile memory chips 110, 120, 130, and 140 as a reserved area or an over provision (OP) area, not provided to the host device 20. A storage space of the reserved area or the OP region may not be open to the host device 20, and a capacity of the reserved area or the OP region may not be provided to the host device 20. The reserved area may include a storage space used to operate the storage device 100. The OP area may include a storage space used to further improve the performance of the storage device 100, in addition to the reserved area.

The storage spaces of the first to fourth nonvolatile memory chips 110, 120, 130, and 140 may be identified and accessed based on physical addresses. Physical addresses included in the first to fourth storage spaces SS1, SS2, SS3, and SS4 from among the physical addresses of the first to fourth nonvolatile memory chips 110, 120, 130, and 140 may be changed. For example, a part, which is provided to the host device 20 through the memory controller 150, from among the storage spaces of the first to fourth nonvolatile memory chips 110, 120, 130, and 140, may be varied.

The memory controller 150 may integrate and manage the physical addresses of the first to fourth storage spaces SS1, SS2, SS3, and SS4 into one physical address group PG. The memory controller 150 may map physical addresses of the physical address group PG and logical addresses of one logical address group LG by using a mapping table MT. The logical address of the logical address group LG may be allocated to the storage device 100 by the host device 20.

The host device 20 may create first to third namespaces NS1, NS2, and NS3 based on the logical address group LG. The first to third namespaces NS1, NS2, and NS3 may correspond (or may be allocated) to different logical addresses belonging to the logical address group LG (or to logical address groups). The host device 20 may give a stream identifier (ID) to each of the first to third namespaces NS1, NS2, and NS3.

For example, a first stream ID may be allocated to the first namespace NS1, a second stream ID may be allocated to the second namespace NS2, and a third stream ID may be allocated to the third namespace NS3. In an example embodiment, the first to third namespaces NS1, NS2, and NS3 may correspond to different applications executable at the host device 20 or may correspond to different users (or accounts of users) accessing the host device 20.

When accessing a specific namespace of the first to third namespaces NS1, NS2, and NS3, the host device 20 may send an access request to the memory controller 150 together with a stream ID of the specific namespace. The memory controller 150 may access the first to fourth storage spaces SS1, SS2, SS3, and SS4, based on a stream ID.

In an example embodiment, a capacity of the first namespace NS1 may correspond to a size of a storage space of one nonvolatile memory chip, a capacity of the second namespace NS2 may correspond to a size of storage spaces of two nonvolatile memory chips, and a capacity of the third namespace NS3 may correspond to a size of a storage space of one nonvolatile memory chip, but a capacity of each of the first to third namespaces NS1, NS2, and ND3 may be varied.

Figure 4:
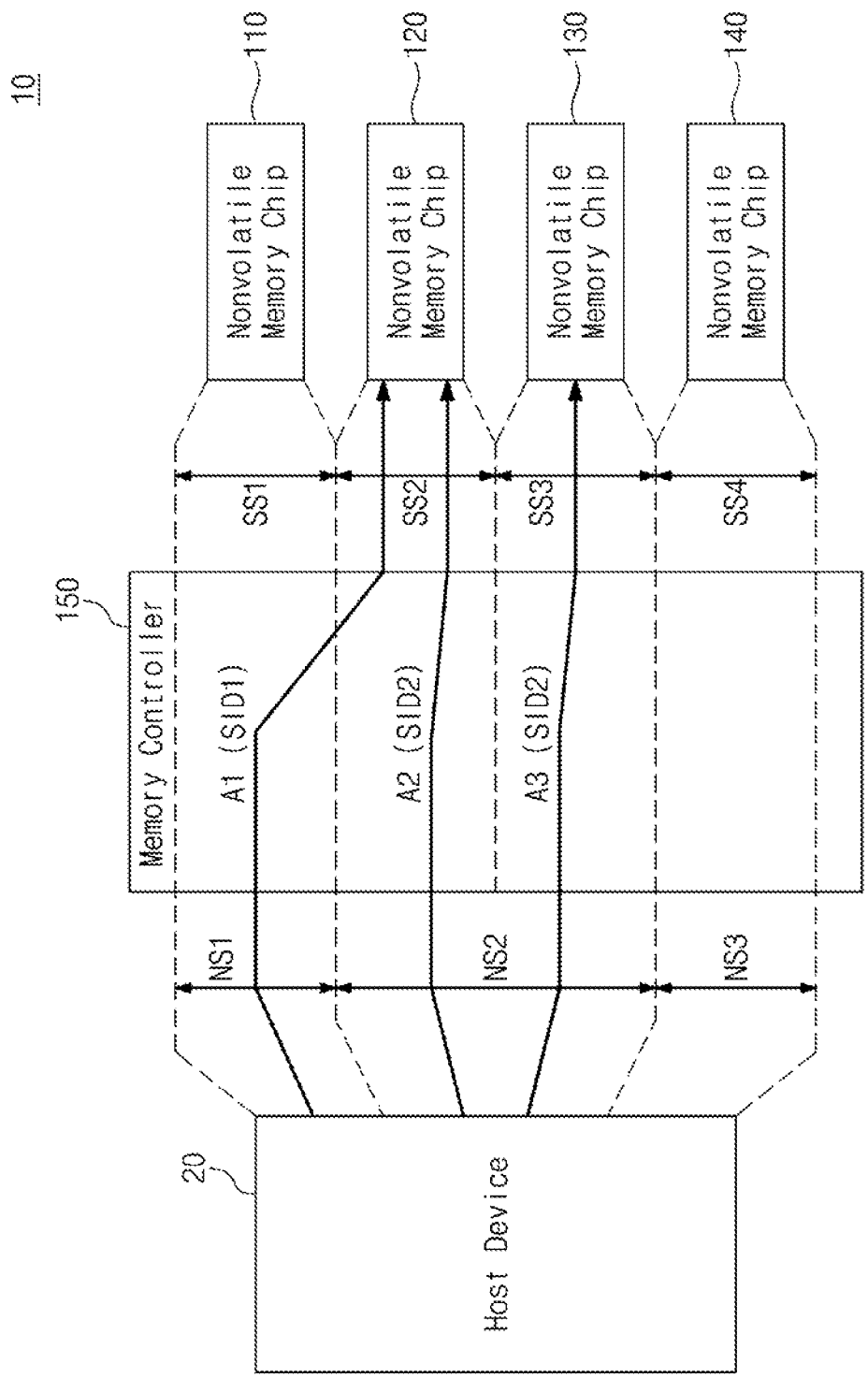
FIG. 4 illustrates an example in which a host device accesses a storage device in an integration mode.

FIG. 4 illustrates an example in which the host device 20 accesses the storage device 100 in the integration mode.

Referring to FIGS. 1, 3, and 4, in the integration mode, the memory controller 150 may map one physical address group PG and one logical address group LG. Each of the first to fourth nonvolatile memory chips 110, 120, 130, and 140 may include a plurality of memory blocks.

The memory controller 150 may access different memory blocks of the memory blocks belonging to the first to fourth nonvolatile memory chips 110, 120, 130, and 140 in response to access requests having different stream IDs received from the host device 20.

For example, as marked by a first arrow A1, the host device 20 may send an access request to the memory controller 150 together with a first stream ID SID1 indicating the first namespace NS1. The memory controller 150 may access one memory block of the second nonvolatile memory chip 120 in response to the access request of the first arrow A1 and the first stream ID SID1.

As marked by a second arrow A2, the host device 20 may send an access request to the memory controller 150 together with a second stream ID SID2 indicating the second namespace NS2. The memory controller 150 may access another memory block of the second nonvolatile memory chip 120 in response to the access request of the second arrow A2 and the second stream ID SID2.

As marked by a third arrow A3, the host device 20 may send an access request to the memory controller 150 together with the second stream ID SID2 indicating the second namespace NS2. The memory controller 150 may access one memory block of the third nonvolatile memory chip 130 in response to the access request of the third arrow A3 and the second stream ID SID2.

In the case where the memory controller 150 performs access requests having different stream IDs on different memory blocks, as marked by the first arrow A1 and the second arrow A2, the access requests having the different stream IDs may be performed on the same nonvolatile memory chip. In such a case, e.g., the access request of the first arrow A1 and the access request of the second arrow A2 should be sequentially performed over time rather than at the same time, but such concurrent access requests from the different stream IDs may act as a delay factor.

Figure 5:
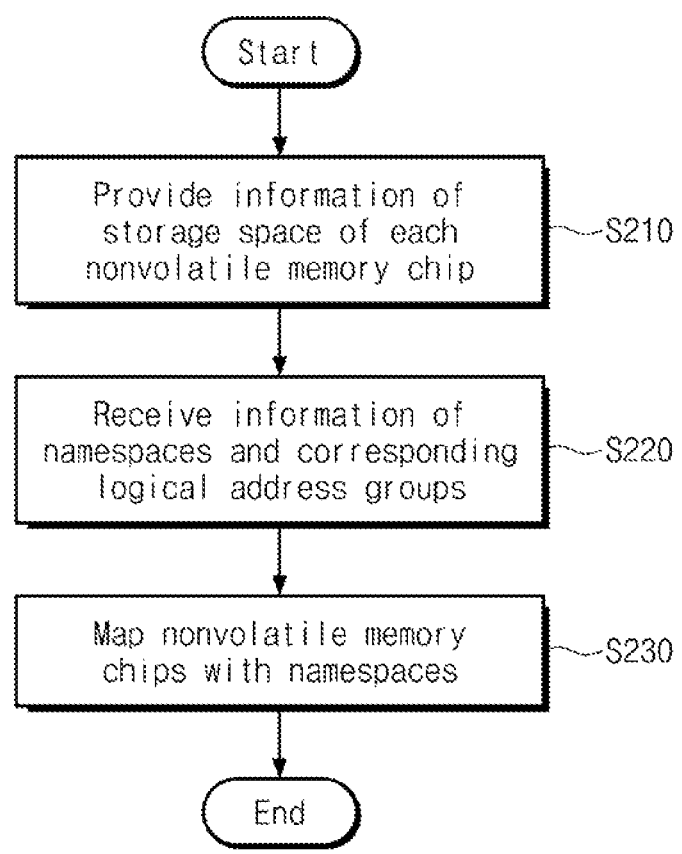
FIG. 5 illustrates an example in which a storage device and a host device set a storage space in an individual mode.

FIG. 5 illustrates an example in which the storage device 100 and the host device 20 set a storage space in the individual mode.

Referring to FIGS. 1 and 5, in operation S210, the storage device 100 may provide information of a storage space of each of the first to fourth nonvolatile memory chips 110, 120, 130, and 140 to the host device 20. For example, the storage device 100 may provide the host device 20 with information of a total storage space specified to be provided to the host device 20 from among the storage spaces of the first to fourth nonvolatile memory chips 110, 120, 130, and 140.

In operation S220, the storage device 100 may receive information of namespaces and logical address groups respectively corresponding to the namespaces from the host device 20. The host device 20 may allocate logical addresses, e.g., continuous logical addresses, to the storage device 100, based on the information of the storage space of each of the first to fourth nonvolatile memory chips 110, 120, 130, and 140.

The host device 20 may allocate namespaces based on logical addresses of logical address groups. Namespaces may be allocated to different logical addresses belonging to logical addresses of a logical address group (e.g., to different logical address groups). The host device 20 may provide the storage device 100 with information of continuous namespaces and logical address groups respectively corresponding to the namespaces.

For example, the host device 20 may access the storage device 100 by an access unit defined by an operating system (or a file system), such as a sector or a cluster, and each of namespaces may include a plurality of access units. Accordingly, each of the namespaces may be regarded as a group of access units sharing a common stream ID. Also, the namespaces may be regarded as groups of access units corresponding to different stream IDs.

In operation S230, the storage device 100 may map the first to fourth nonvolatile memory chips 110, 120, 130, and 140 with the namespaces. For example, the storage device 100 may map storage spaces of the first to fourth nonvolatile memory chips 110, 120, 130, and 140 with logical address groups of the namespaces, respectively.

A logical address group of each namespace may be mapped with a storage space of at least one nonvolatile memory chip. Thus, the storage device 100 may map a storage space with each namespace in units of nonvolatile memory chip.

Figure 6:
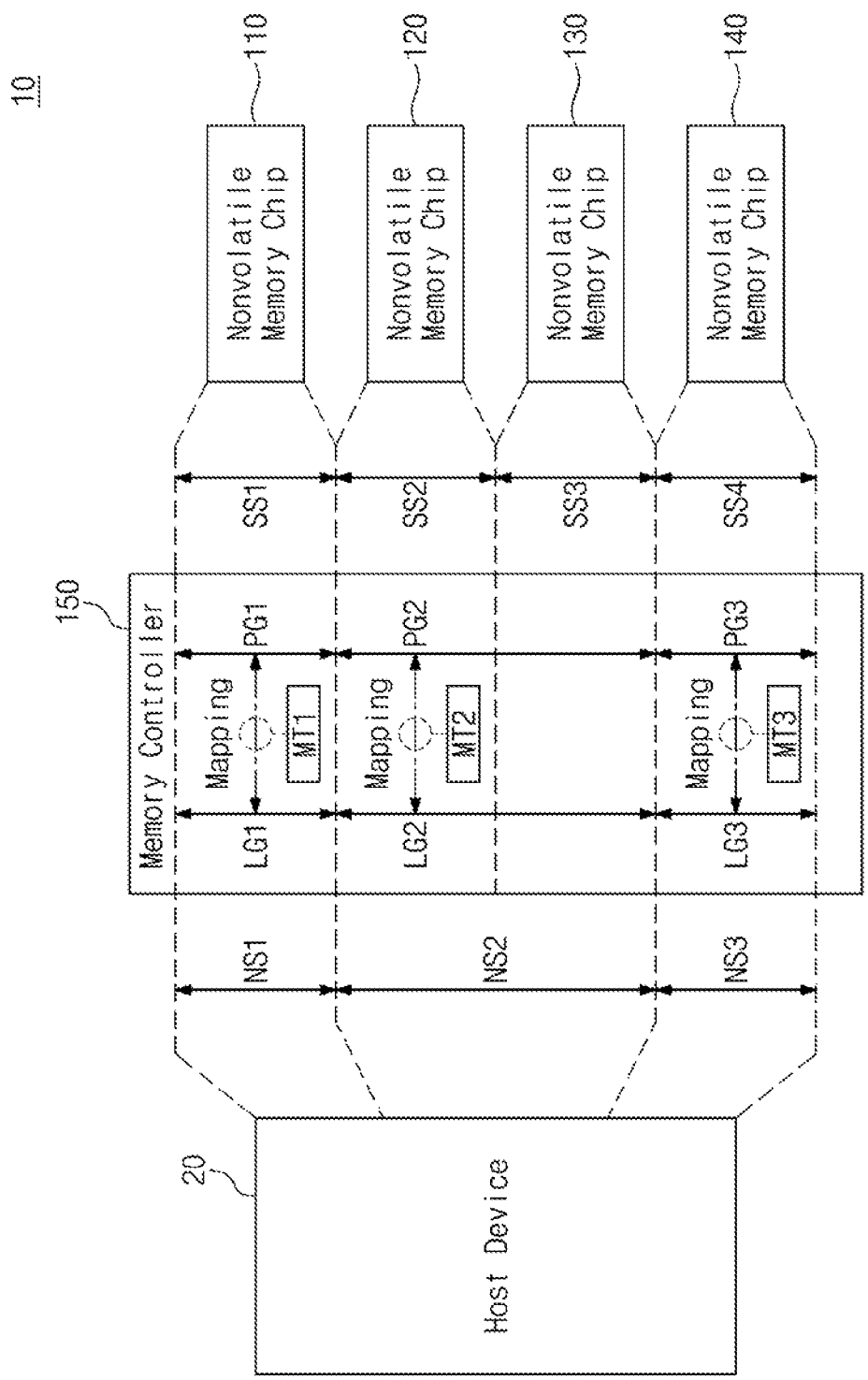
FIG. 6 illustrates an example in which a memory controller provides a host device with storage spaces of first to fourth nonvolatile memory chips based on a process of FIG. 5, in an individual mode.

FIG. 6 illustrates an example in which the memory controller 150 provides the host device 20 with storage spaces of the first to fourth nonvolatile memory chips 110, 120, 130, and 140 based on the process of FIG. 5, in the individual mode.

Referring to FIGS. 1 and 6, the memory controller 150 may provide information of the first to fourth storage spaces SS1, SS2, SS3, and SS4 of the first to fourth nonvolatile memory chips 110, 120, 130, and 140 to the host device 20.

The host device 20 may allocate the first to third namespaces NS1 to NS3 based on the information of the first to fourth storage spaces SS1, SS2, SS3, and SS4. The host device 20 may allocate namespaces in units of storage space of a nonvolatile memory chip.

For example, the host device 20 may create the first namespace NS1 corresponding to a capacity of a storage space of one nonvolatile memory chip, the host device 20 may create the second namespace NS2 corresponding to a capacity of a storage space of two nonvolatile memory chips, and the host device 20 may create the third namespace NS3 corresponding to a capacity of a storage space of one nonvolatile memory chip. The host device 20 may allocate first to third logical address groups LG1, LG2, and LG3 (different from each other) to the first to third namespaces NS1 to NS3.

The host device 20 may provide the memory controller 150 with information (e.g., including the number or a size of each) of the first to third namespaces NS1, NS2, and NS3, along with information of the first to third logical address groups LG1, LG2, and LG3 allocated to the first to third namespaces NS1, NS2, and NS3.

The memory controller 150 may select first to third physical address groups PG1, PG2, and PG3 respectively corresponding to the first to third logical address groups LG1, LG2, and LG3 from the first to fourth storage spaces SS1, SS2, SS3, and SS4, based on the information received from the host device 20.

For example, the memory controller 150 may select physical addresses of the first storage space SS1 as the first physical address group PG1, the memory controller 150 may select physical addresses of the second and third storage spaces SS2 and SS3 as the second physical address group PG2, and the memory controller 150 may select physical addresses of the fourth storage space SS4 as the third physical address group PG3.

The memory controller 150 may map the first to third logical address groups LG1, LG2, and LG3 with the first to third physical address groups PG1, PG2, and PG3, respectively.

For example, the memory controller 150 may map the first logical address group LG1 and the first physical address group PG1 by using a first mapping table MT, the memory controller 150 may map the second logical address group LG2 and the second physical address group PG2 by using a second mapping table MT2, and the memory controller 150 may map the third logical address group LG3 and the third physical address group PG3 by using a third mapping table MT3.

When accessing a specific namespace of the first to third namespaces NS1, NS2, and NS3, the host device 20 may send an access request to the memory controller 150 together with a stream ID of the specific namespace. The memory controller 150 may access the first to fourth storage spaces SS1, SS2, SS3, and SS4, based on a stream ID.

In the above example embodiment, additional description associated with components applied in common to FIGS. 3 and 6 will be omitted to avoid redundancy. Accordingly, components, which do not conflict with the components of FIG. 6, from among the components described with reference to FIG. 3 may be identically applied to FIG. 6.

Figure 7:
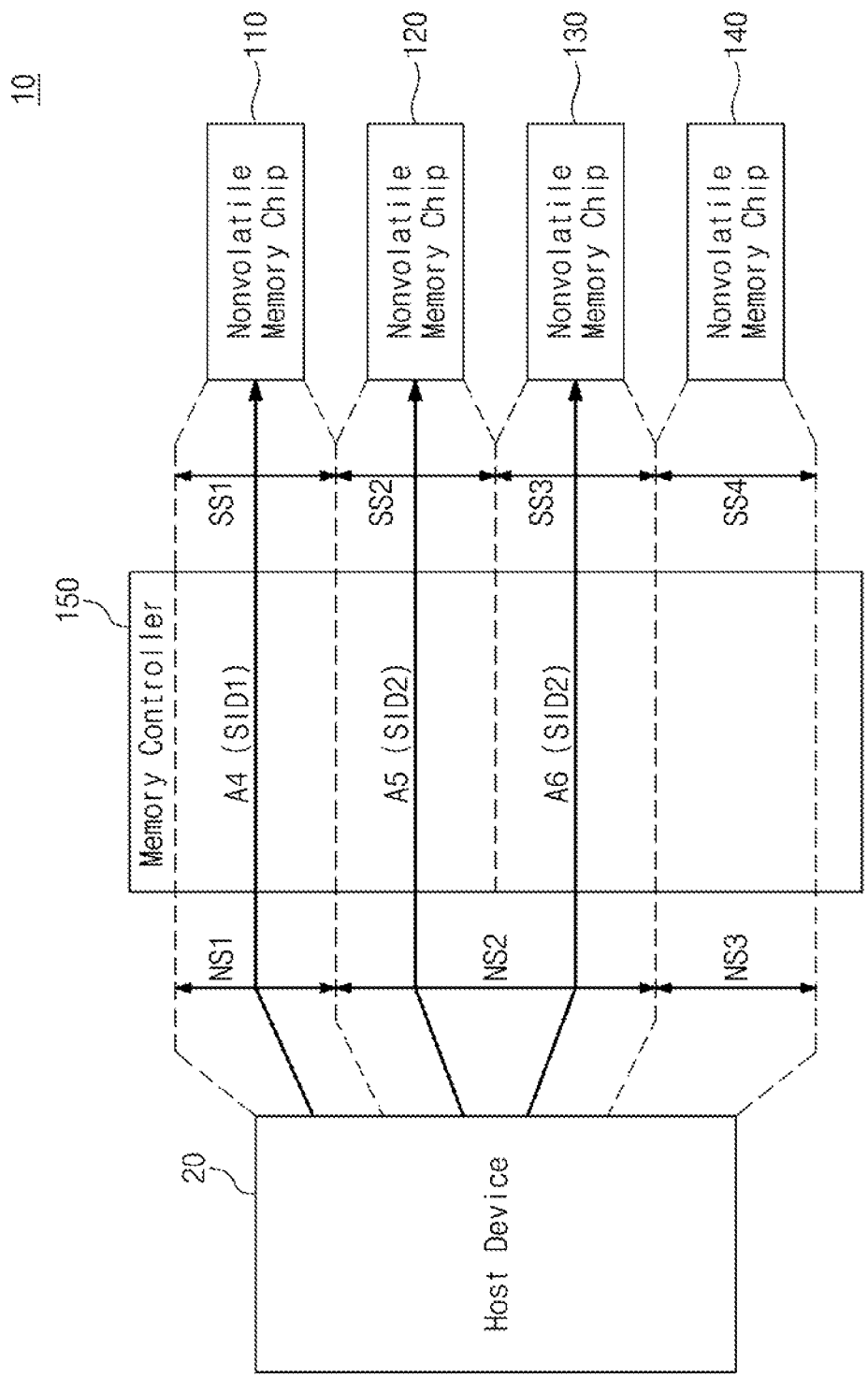
FIG. 7 illustrates an example in which a host device accesses a storage device in an individual mode.

FIG. 7 illustrates an example in which the host device 20 accesses the storage device 100 in the individual mode.

Referring to FIGS. 1, 6, and 7, the memory controller 150 may access different nonvolatile memory chips of the first to fourth nonvolatile memory chips 110, 120, 130, and 140 in response to access requests having different stream IDs received from the host device 20.

For example, as marked by a fourth arrow A4, the host device 20 may send an access request to the memory controller 150 together with the first stream ID SID1 indicating the first namespace NS1. The memory controller 150 may access the first nonvolatile memory chip 110 mapped with the first namespace NS1 in response to the access request of the fourth arrow A4 and the first stream ID SID1.

As marked by a fifth arrow A5, the host device 20 may send an access request to the memory controller 150 together with the second stream ID SID2 indicating the second namespace NS2. The memory controller 150 may access the second and third nonvolatile memory chips 120 and 130 mapped with the second namespace NS2 in response to the access request of the fifth arrow A5 and the second stream ID SID2.

As marked by a sixth arrow A6, the host device 20 may send an access request to the memory controller 150 together with the second stream ID SID2 indicating the second namespace NS2. The memory controller 150 may access the second and third nonvolatile memory chips 120 and 130 mapped with the second namespace NS2 in response to the access request of the sixth arrow A6 and the second stream ID SID2.

In the case where the memory controller 150 performs access requests having different stream IDs on different memory blocks, the access requests having the different stream IDs may be performed on different nonvolatile memory chips. Accordingly, access requests having different stream IDs may be prevented from acting as a mutual delay factor.

In an example embodiment, as is the case for the second namespace NS2 in the above example, when one namespace is mapped with two or more nonvolatile memory chips, an access request for the corresponding namespace may be interleaved to two or more nonvolatile memory chips. For example, data corresponding to one access request may be divided based on the number of nonvolatile memory chips. The divided data may be simultaneously exchanged with the nonvolatile memory chips.

In an example embodiment, an access request for a namespace mapped with one nonvolatile memory chip may not be interleaved.

Figure 8:
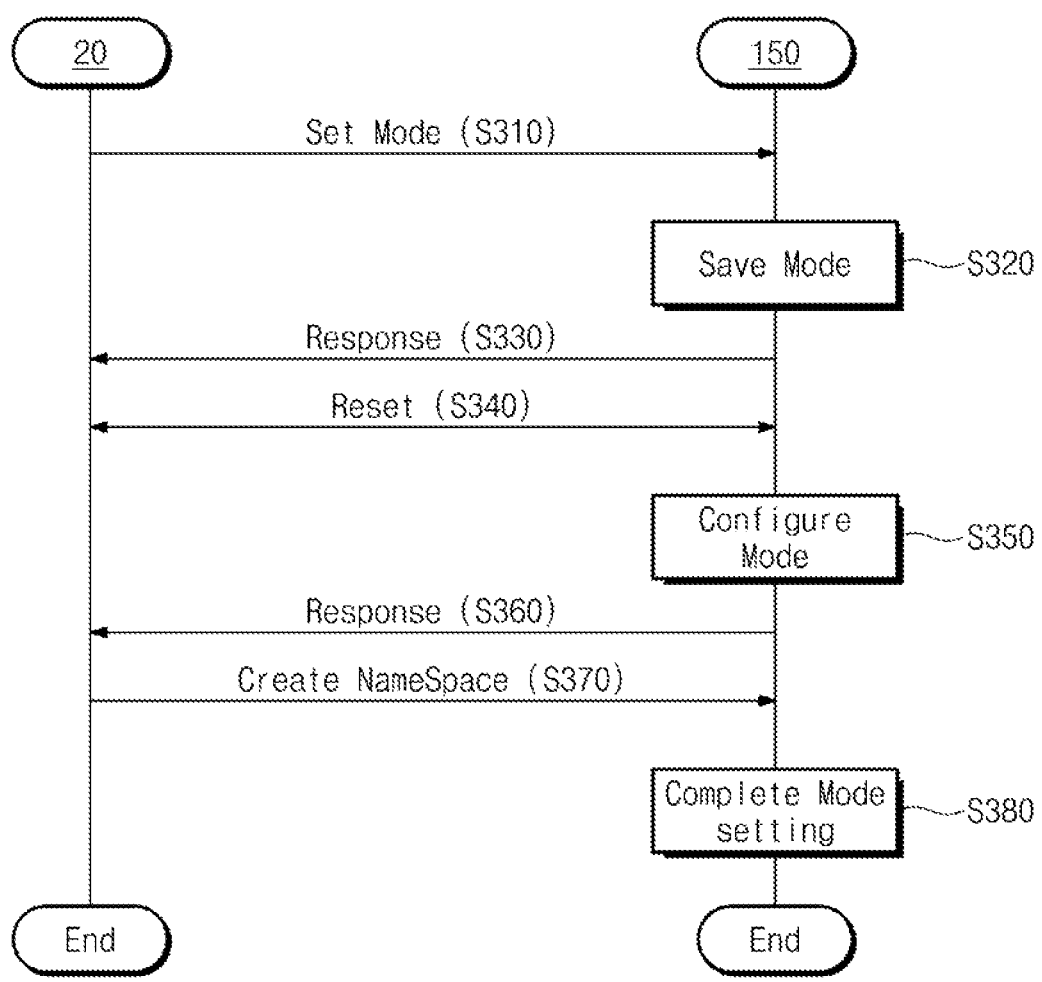
FIG. 8 illustrates an example of a process in which a storage device and a host device configure an individual mode.

FIG. 8 illustrates an example of a process in which the storage device 100 and the host device 20 configure the individual mode.

Referring to FIGS. 1 and 8, in operation S310, the host device 20 may send a mode set request to the memory controller 150. The mode set request may include information about the individual mode, e.g., information about the number of namespaces, a size of each of the namespaces, and a logical address group allocated to each of the namespaces.

In operation S320, the memory controller 150 may save or store mode setting information in response to the mode set request. The memory controller 150 may determine whether the individual mode set requested by the host device 20 is configurable (e.g., is capable of being mapped).

For example, the memory controller 150 may determine whether physical address groups are configurable as much as the number corresponding to the mode set request of the host device 20 (e.g., whether to support stream IDs, the number of which corresponds to the number of physical address groups), may determine whether a size of each of the physical address groups is configurable, and may determine whether to map logical address groups with the physical address groups (or whether the configuration of mapping tables is possible).

In operation S330, the memory controller 150 may send a response to the host device 20. The response may include information indicating whether the mode setting information is completely stored and whether the configuration of the mode is possible.

When the configuration of the mode is not possible, the host device 20 and the storage device 100 may terminate the configuration of the mode.

When the configuration of the mode is possible, in operation S340, the host device 20 and the memory controller 150 may perform a reset. The reset may include a cold reset in which a power is interrupted and is then supplied, or a hot reset in which initialization is performed, with a power maintained.

In operation S350, the memory controller 150 may configure the individual mode based on the mode setting information. For example, as described with reference to FIG. 6, the memory controller 150 may configure the first to third physical address groups PG1, PG2, and PG3 and the first to third mapping tables MT1, MT2, and MT3.

In operation S360, the memory controller 150 may send, to the host device 20, a response indicating that the configuration of the individual mode is completed.

In response, in operation S370, the host device 20 may send a request for creating a namespace to the memory controller 150. The request for creating a namespace may include information of stream IDs to be allocated to namespaces.

In response to the request for creating a namespace, in operation S380, the memory controller 150 may map the first to third logical address groups LG1, LG2, and LG3 with the first to third physical address groups PG1, PG2, and PG3, respectively. Also, the memory controller 150 may correlate the first to third logical address groups LG1, LG2, and LG3 with the first to third stream IDs SID1, SID2, and SID3, respectively.

Figure 9:
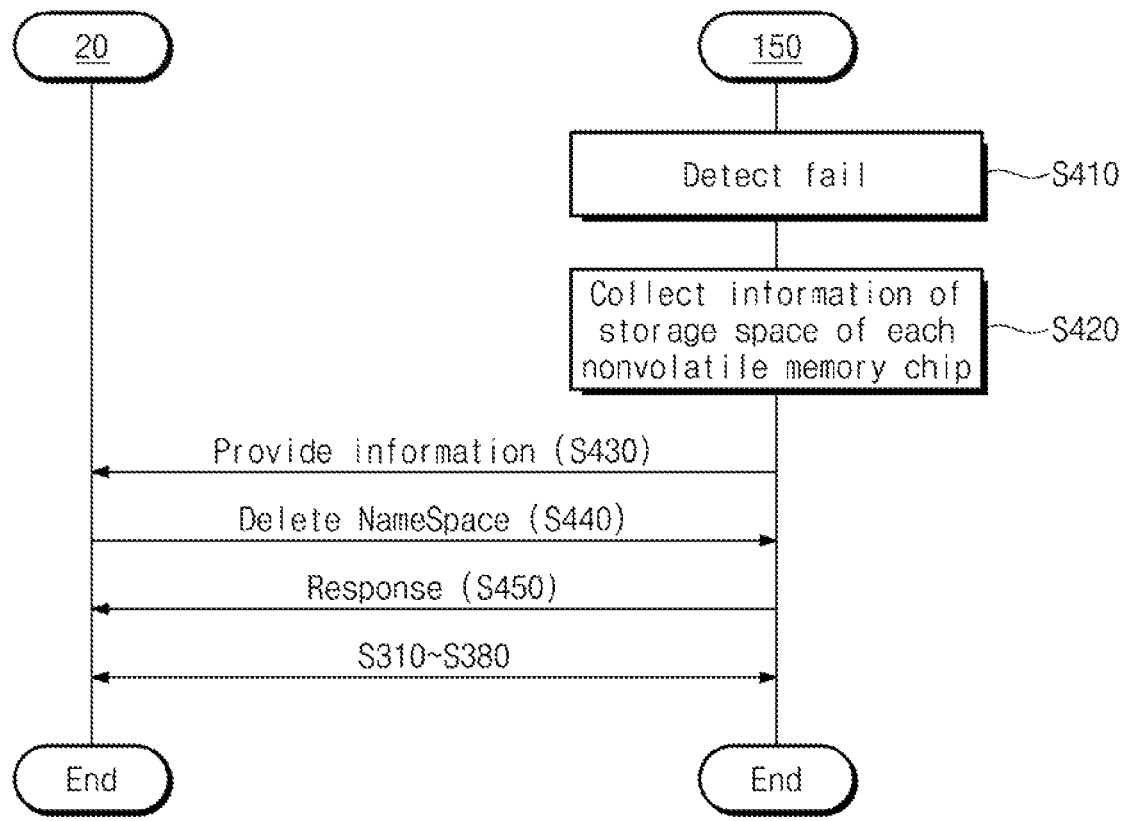
FIG. 9 illustrates an example in which a storage device and a host device update a configuration of an individual mode.

FIG. 9 illustrates an example in which the storage device 100 and the host device 20 update a configuration of the individual mode.

Referring to FIGS. 1 and 9, in operation S410, the memory controller 150 may detect a fail. For example, when an error that is uncorrectable by an error correction algorithm occurs in at least a portion of a storage space of at least one nonvolatile memory chip of the first to fourth nonvolatile memory chips 110, 120, 130, and 140, the memory controller 150 may detect that a fail occurs in the at least a portion of the storage space, in which the error occurs.

In response to the detection of the fail, in operation S420, the memory controller 150 may collect information of a storage space of each nonvolatile memory chip. For example, the memory controller 150 may exclude the at least a portion of the storage space, in which the error occurs, from the storage space of the nonvolatile memory chip where the fail occurs. Thus, the storage space (or capacity) of the nonvolatile memory chip where the fail is detected may decrease.

In operation S430, the memory controller 150 may provide the host device 20 with information providing notification that the fail occurred, and information of storage spaces of the first to fourth nonvolatile memory chips 110, 120, 130, and 140, which are changed due to the fail.

The host device 20 may reconfigure the individual mode in response to the information provided from the memory controller 150. For example, the host device 20 may update at least one of parameters, which constitute the individual mode, such as the number of namespaces, a capacity of each of the namespaces, and a logical address group allocated to each of the namespaces. When the parameters constituting the individual mode are completely updated, in operation S440, the host device 20 may send a request for deleting namespaces to the memory controller 150.

The memory controller 150 may release the configuration of the individual mode in response to the request for deleting namespaces.

For example, the memory controller 150 may remove the first to third physical address groups PG1, PG2, and PG3 and the first to third mapping tables MT1, MT2, and MT3.

For another example, the memory controller 150 may release the configuration of the individual mode in a state of maintaining data stored in the first to fourth nonvolatile memory chips 110, 120, 130, and 140.

For another example, the memory controller 150 may perform (or reserve) erasing of data stored in the first to fourth nonvolatile memory chips 110, 120, 130, and 140 and may release the configuration of the individual mode.

Once the configuration of the individual mode is released, in operation S450, the memory controller 150 may send, to the host device 20, a response providing notification that namespaces are removed.

Afterwards, through operation S310 to operation S380 of FIG. 8, the host device 20 and the memory controller 150 may configure new namespaces.

In an example embodiment, when namespaces are updated as described with reference to FIG. 9, there may be updated at least one of the following: 1) the number of namespaces, 2) a capacity of each of the namespaces, 3) logical address groups respectively allocated to the namespaces, 4) a nonvolatile memory chip(s) allocated to each of the namespaces, 5) the number of nonvolatile memory chips allocated to each of the namespaces, 6) a physical address group of nonvolatile memory chips allocated to each of the namespaces, 7) stream IDs respectively allocated to the namespaces, and 8) the number of stream IDs respectively allocated to the namespaces.

Figure 10:
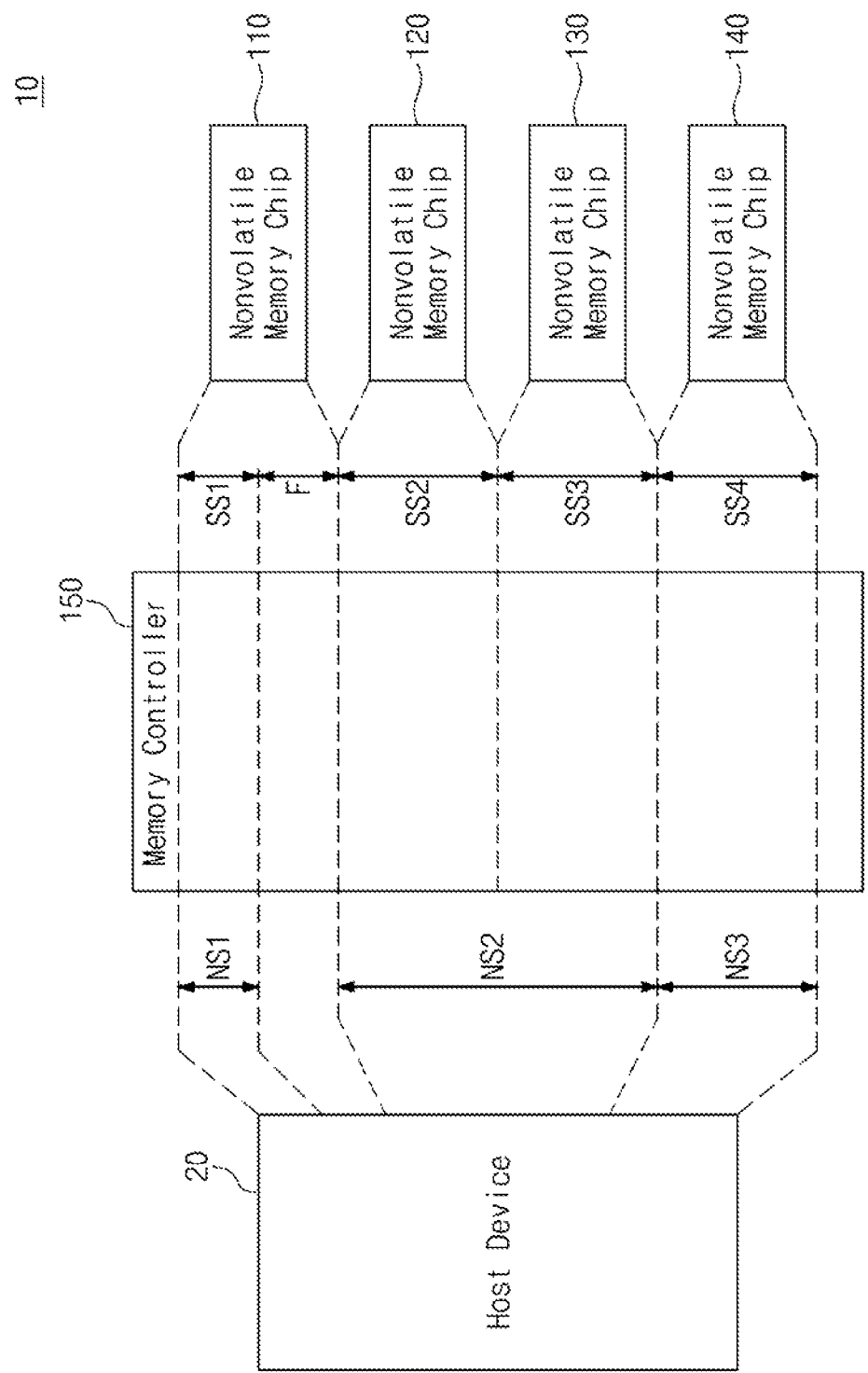
FIG. 10 illustrates a first example in which namespaces are updated in response to detecting a fail.

FIG. 10 illustrates a first example in which namespaces are updated in response to detecting a fail "F".

Referring to FIGS. 6 and 10, a fail "F" may be detected in a portion of a storage space of the first nonvolatile memory chip 110.

As the fail "F" is detected, a size of the first storage space SS1 that the first nonvolatile memory chip 110 provides to the host device 20 through the memory controller 150 may decrease (compared to that of FIG. 6).

In response to the detection of the fail "F", the host device 20 may reduce a capacity (or a size) of the first namespace NS1. The first namespace NS1 of the reduced size may be mapped with the first nonvolatile memory chip 110 having the first storage space SS1 of the reduced size.

For another example, the host device 20 may reduce a size of the second namespace NS2 or the third namespace NS3. In the case where the size of the second namespace NS2 is reduced, the first namespace NS1 may be mapped with a nonvolatile memory chip in which the fail "F" is not detected. The first nonvolatile memory chip 110 where the fail "F" is detected and a nonvolatile memory chip where the fail "F" is not detected may be mapped with the second namespace NS2.

In the case where the size of the third namespace NS3 is reduced, the first namespace NS1 may be mapped with a nonvolatile memory chip in which the fail "F" is not detected. The third namespace NS3 may be mapped with the first nonvolatile memory chip 110 where the fail "F" is detected.

Figure 11:
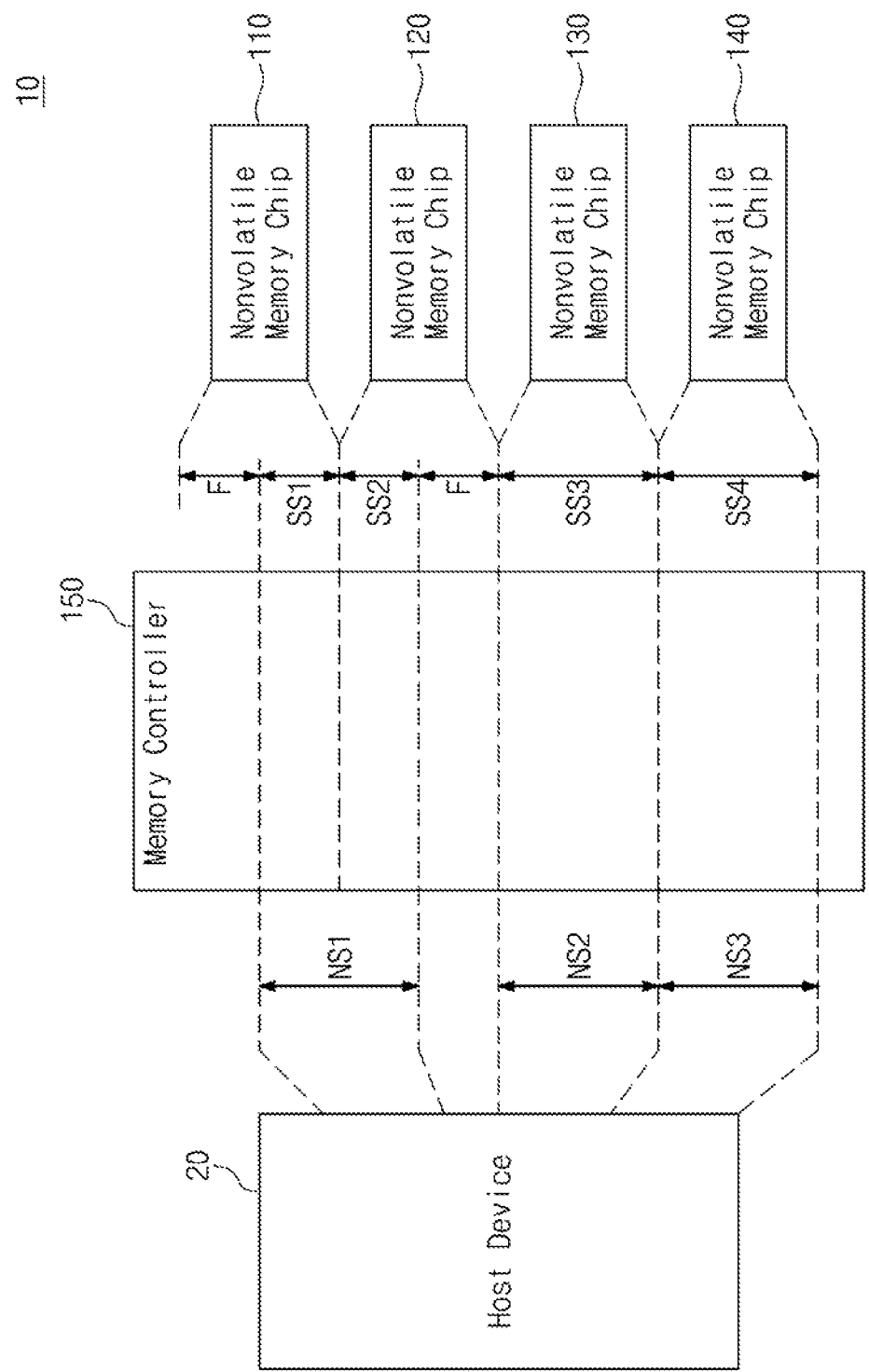
FIG. 11 illustrates a second example in which namespaces are updated in response to detecting a fail.

FIG. 11 illustrates a second example in which namespaces are updated in response to detecting a fail "F".

Referring to FIGS. 6 and 11, a fail "F" may be detected in a portion of a storage space of the first nonvolatile memory chip 110 and in a portion of a storage space of the second nonvolatile memory chip 120.

As the fail "F" is detected, a size of the first storage space SS1 that the first nonvolatile memory chip 110 provides to the host device 20 through the memory controller 150 and a size of the second storage space SS2 that the second nonvolatile memory chip 120 provides to the host device 20 through the memory controller 150 may decrease (compared to that of FIG. 6).

In response to the detection of the fail "F", the host device 20 may reduce a capacity (or a size) of the second namespace NS2. The second namespace NS2 of the reduced size may be mapped with the first nonvolatile memory chip 110 having the first storage space SS1 of the reduced size and the second nonvolatile memory chip 120 having the second storage space SS2 of the reduced size.

For another example, the host device 20 may reduce the number of namespaces. For example, the host device 20 may remove the first namespace NS1 or may remove the third namespace NS3. The host device 20 and the storage device 100 may have one namespace corresponding to a storage space of one nonvolatile memory chip and another namespace corresponding to storage spaces of two nonvolatile memory chips.

Figure 12:
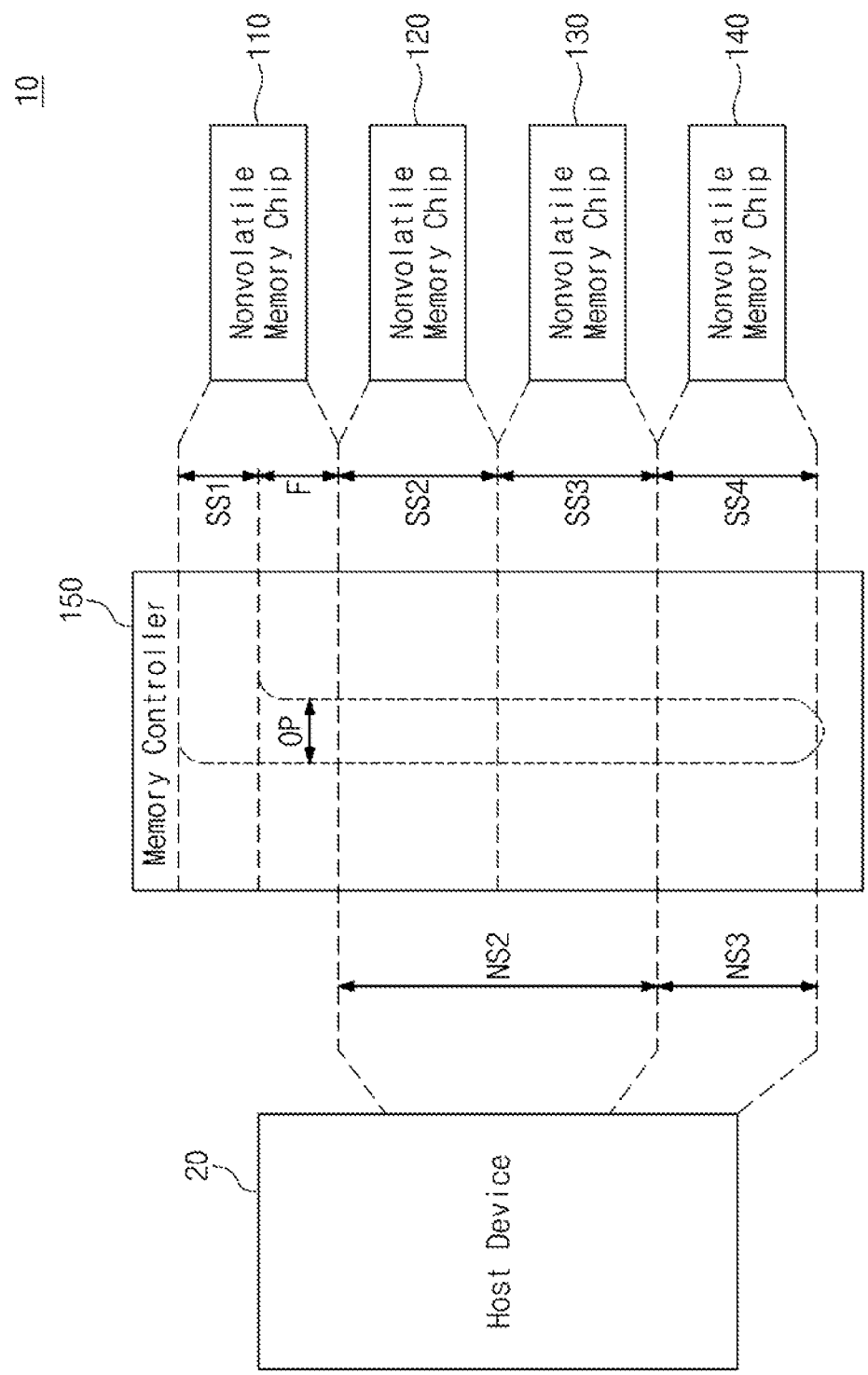
FIG. 12 illustrates a third example in which namespaces are updated in response to detecting a fail.

FIG. 12 illustrates a third example in which namespaces are updated in response to detecting a fail "F".

Referring to FIGS. 6 and 12, a fail "F" may be detected in a portion of a storage space of the first nonvolatile memory chip 110.

As the fail "F" is detected, a size of the first storage space SS1 that the first nonvolatile memory chip 110 provides to the host device 20 through the memory controller 150 may decrease (compared to that of FIG. 6).

In response to the detection of the fail "F", the host device 20 may remove the first namespace NS1. The host device 20 may update parameters of namespaces such that the reduced first storage space SS1 of the first nonvolatile memory chip 110 is used as an OP area of at least one of the second to fourth storage spaces SS2, SS3, and SS4 of the second to fourth nonvolatile memory chips 120, 130, and 140.

For another example, in a state where the reduced first storage space SS1 of the first nonvolatile memory chip 110 is used as an OP area, the third namespace NS3 may be removed, or the size of the second namespace NS2 may be reduced.

Figure 13:
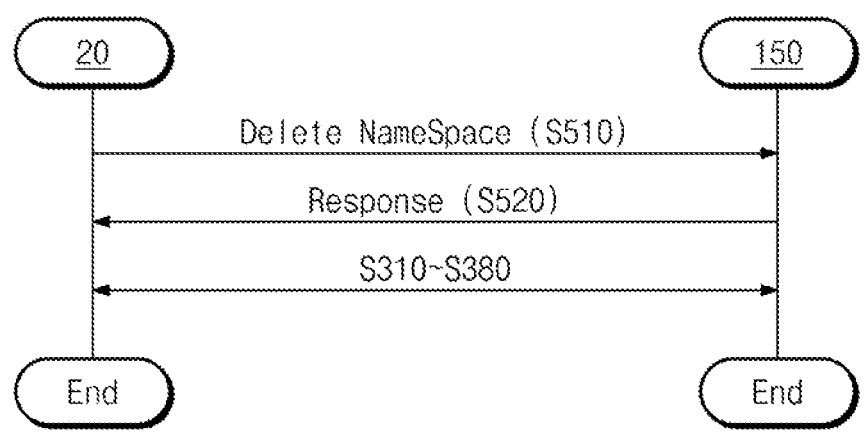
FIG. 13 illustrates another example in which a storage device and a host device configure an individual mode.

FIG. 13 illustrates another example in which the storage device 100 and the host device 20 configure the individual mode.

Referring to FIGS. 1 and 13, the host device 20 may initiate reconfiguration of the individual mode without information from the memory controller 150. For example, the host device 20 may update at least one of parameters, which constitute the individual mode, such as the number of namespaces, a capacity of each of the namespaces, and a logical address group allocated to each of the namespaces.

When the parameters constituting the individual mode are completely updated, in operation S510, the host device 20 may send a request for deleting namespaces to the memory controller 150.

The memory controller 150 may release the configuration of the individual mode in response to the request for deleting namespaces.

For example, the memory controller 150 may remove the first to third physical address groups PG1, PG2, and PG3 and the first to third mapping tables MT1, MT2, and MT3.

For another example, the memory controller 150 may release the configuration of the individual mode in a state of maintaining data stored in the first to fourth nonvolatile memory chips 110, 120, 130, and 140.

For another example, the memory controller 150 may perform (or reserve) erasing of data stored in the first to fourth nonvolatile memory chips 110, 120, 130, and 140 and may release the configuration of the individual mode.

In response to the configuration of the individual mode being released, in operation S520, the memory controller 150 may send, to the host device 20, a response providing notification that namespaces are removed.

Afterwards, through operation S310 to operation S380 of FIG. 8, the host device 20 and the memory controller 150 may configure new namespaces.

In an example embodiment, the host device 20 may initiate an update of namespaces based on applications associated with the namespaces or user demands such as a capacity and a service quality (e.g., a speed).

Figure 14:
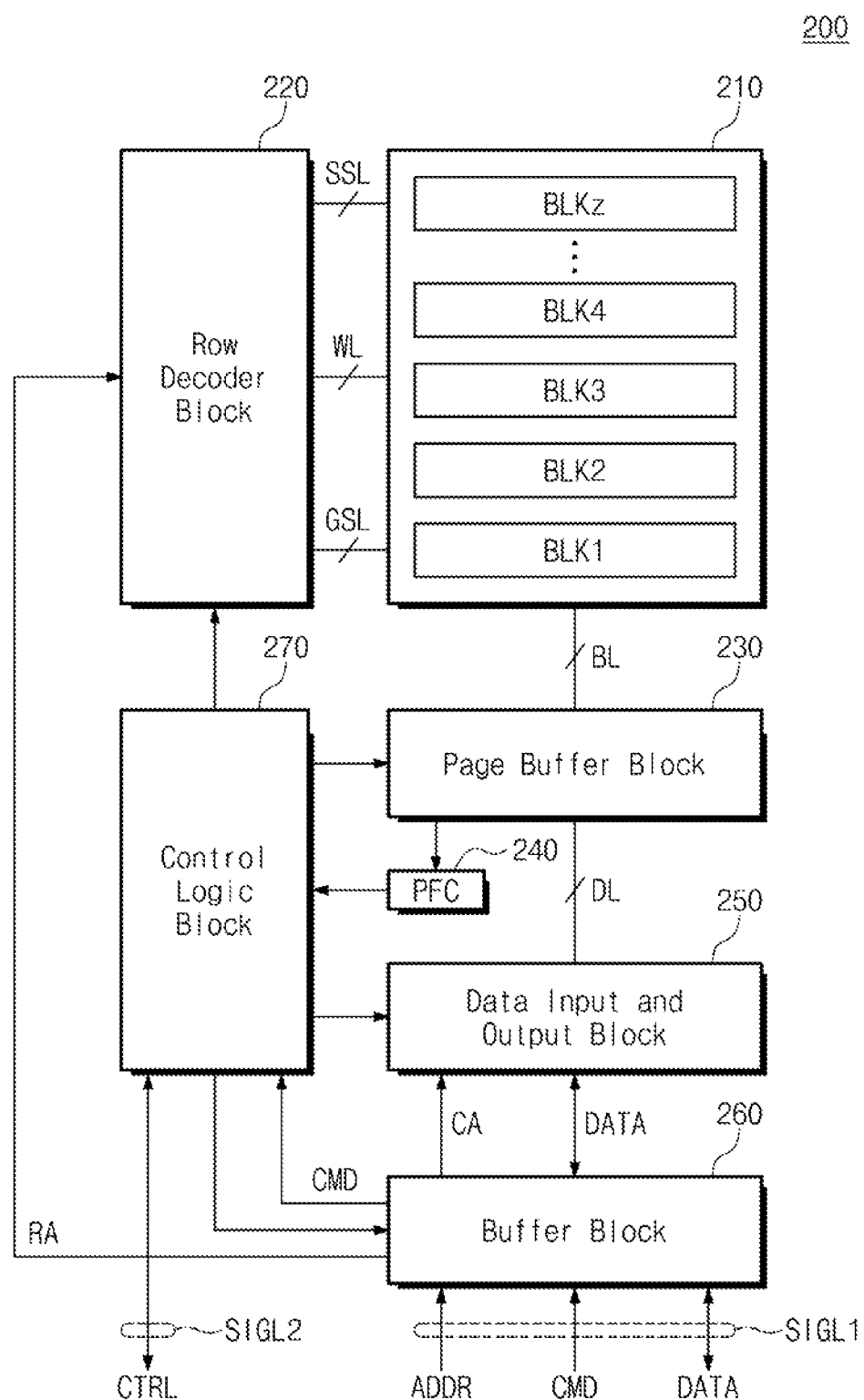
FIG. 14 is a block diagram illustrating a nonvolatile memory chip according to an example embodiment.

FIG. 14 is a block diagram illustrating a nonvolatile memory chip 200 according to an example embodiment. In an example embodiment, the nonvolatile memory chip 200 may correspond to each of the first to fourth nonvolatile memory chips 110, 120, 130, and 140 of FIG. 1.

Referring to FIG. 14, the nonvolatile memory chip 200 may include a memory cell array 210, a row decoder block 220, a page buffer block 230, a pass/fail check block (PFC) 240, a data input and output block 250, a buffer block 260, and a control logic block 270.

The memory cell array 210 may include a plurality of memory blocks BLK1 to BLKz. Each of the memory blocks BLK1 to BLKz may include a plurality of memory cells. Each of the memory blocks BLK1 to BLKz may be connected with the row decoder block 220 through ground selection lines GSL, word lines WL, and string selection lines SSL. Some of the word lines WL may be used as dummy word lines. Each of the memory blocks BLK1 to BLKz may be connected with the page buffer block 230 through a plurality of bit lines BL. The plurality of memory blocks BLK1 to BLKz may be connected in common with the plurality of bit lines BL.

In an example embodiment, each of the plurality of memory blocks BLK1 to BLKz may be a unit of an erase operation. The memory cells belonging to each of the memory blocks BLK1 to BLKz may be erased at the same time. For another example, each of the plurality of memory blocks BLK1 to BLKz may be divided into a plurality of sub-blocks. Each of the plurality of sub-blocks may correspond to a unit of an erase operation.

The row decoder block 220 may be connected with the memory cell array 210 through the ground selection lines GSL, the word lines WL, and the string selection lines SSL. The row decoder block 220 may operate under control of the control logic block 270.

The row decoder block 220 may decode a row address RA received from the buffer block 260, and may control voltages to be applied to the string selection lines SSL, the word lines WL, and the ground selection lines GSL based on the decoded row address.

The page buffer block 230 may be connected with the memory cell array 210 through the plurality of bit lines BL. The page buffer block 230 may be connected with the data input and output block 250 through a plurality of data lines DL. The page buffer block 230 may operate under control of the control logic block 270.

In a program operation, the page buffer block 230 may store data to be written in memory cells. The page buffer block 230 may apply voltages to the plurality of bit lines BL based on the stored data. In a read operation or in a verify read operation that is performed in the program operation or an erase operation, the page buffer block 230 may sense voltages of the bit lines BL, and may store a sensing result.

In the verify read operation associated with the program operation or the erase operation, the pass/fail check block 240 may verify the sensing result of the page buffer block 230. For example, in the verify read operation associated with the program operation, the pass/fail check block 240 may count the number of values (e.g., the number of 0s) respectively corresponding to on-cells that are not programmed to a target threshold voltage or more.

In the verify read operation associated with the erase operation, the pass/fail check block 240 may count the number of values (e.g., the number of 1s) respectively corresponding to off-cells that are not erased to a target threshold voltage or less.

When a counting result is a threshold value or more, the pass/fail check block 240 may output a fail signal to the control logic block 270. When the counting result is smaller than the threshold value, the pass/fail check block 240 may output a pass signal to the control logic block 270. Depending on a verification result of the pass/fail check block 240, a program loop of the program operation may be further performed, or an erase loop of the erase operation may be further performed.

The data input and output block 250 may be connected with the page buffer block 230 through the plurality of data lines DL. The data input and output block 250 may receive a column address CA from the buffer block 260. The data input and output block 250 may output data read by the page buffer block 230 to the buffer block 260 depending on the column address CA. The data input and output block 250 may provide data received from the buffer block 260 to the page buffer block 230, based on the column address CA.

Through first signal lines SIGL1, the buffer block 260 may receive a command CMD and an address ADDR from an external device and may exchange data "DATA" with the external device. The buffer block 260 may operate under control of the control logic block 270. The buffer block 260 may provide the command CMD to the control logic block 270. The buffer block 260 may provide the row address RA of the address ADDR to the row decoder block 220 and may provide the column address CA of the address ADDR to the data input and output block 250. The buffer block 260 may exchange the data "DATA" with the data input and output block 250.

The control logic block 270 may exchange control signals CTRL with the external device through second signal lines SIGL2. The control logic block 270 may allow the buffer block 260 to route the command CMD, the address ADDR, and the data "DATA". The control logic block 270 may decode the command CMD received from the buffer block 260 and may control the nonvolatile memory chip 200 based on the decoded command.

In an example embodiment, the nonvolatile memory chip 200 may be manufactured in a bonding manner. The memory cell array 210 may be manufactured at a first wafer, and the row decoder block 220, the page buffer block 230, the data input and output block 250, the buffer block 260, and the control logic block 270 may be manufactured at a second wafer. The nonvolatile memory chip 200 may be implemented by coupling the first wafer and the second wafer such that an upper surface of the first wafer and an upper surface of the second wafer face each other.

For another example, the nonvolatile memory chip 200 may be manufactured in a cell over peri (COP) manner. The peripheral circuit including the row decoder block 220, the page buffer block 230, the data input and output block 250, the buffer block 260, and the control logic block 270 may be implemented on a substrate. The memory cell array 210 may be implemented over the peripheral circuit. The peripheral circuit and the memory cell array 210 may be connected by using through vias.

In an example embodiment, a memory block may correspond to a unit by which a size of a storage space of the nonvolatile memory chip 200 is reduced when a fail occurs. When a fail occurs, a memory block, which includes a storage space where the fail occurs, from among the memory blocks BLK1 to BLKz of the nonvolatile memory chip 200, may be ruled out of a storage space of the nonvolatile memory chip 200.

Figure 15:
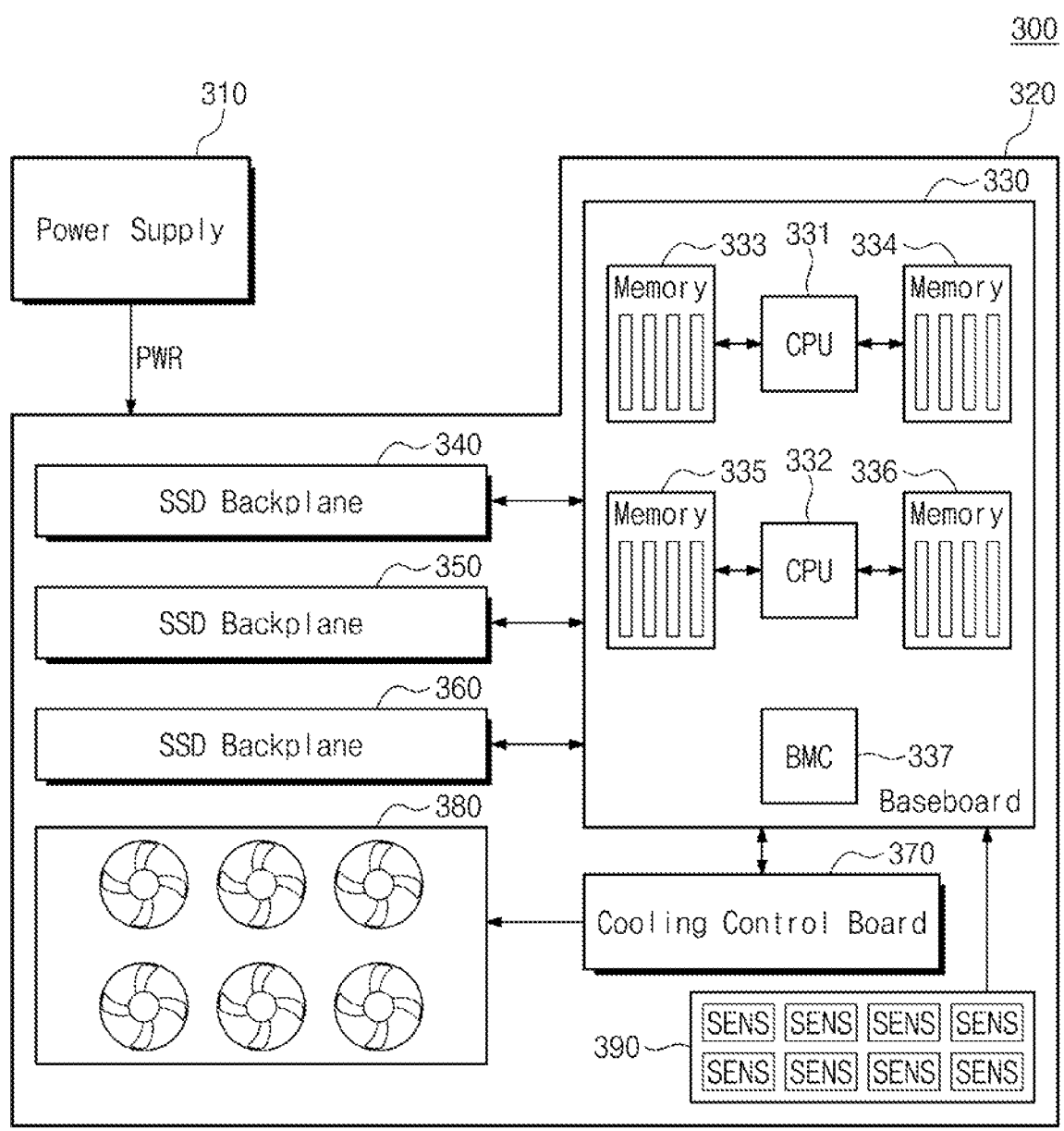
FIG. 15 illustrates an electronic device according to an example embodiment.

FIG. 15 illustrates an electronic device 300 according to an example embodiment. In an example embodiment, the electronic device 300 may be a server.

Referring to FIG. 15, the electronic device 300 may include a power supply 310 and a body 320.

The power supply 310 may generate a power PWR from an external power and may supply the generated power PWR to the body 320. The power PWR may be provided such that two or more different voltages are supplied.

The body 320 may receive the power PWR from the power supply 310 and may operate based on the power PWR.

The body 320 may include a baseboard 330, a first solid state drive (SSD) backplane 340, a second SSD backplane 350, a third SSD backplane 360, a cooling control board 370, coolers 380, and sensors (SENS) 390.

The baseboard 330 may include a first central processing unit (CPU) 331, a second CPU 332, first memories 333 and second memories 334 connected with the first CPU 331, third memories 335 and fourth memories 336 connected with the second CPU 332, and a baseboard management board (BMC) 337. The baseboard 330 may supply the power PWR received from the power supply 310 to the first CPU 331, the second CPU 332, the first memories 333, the second memories 334, the third memories 335, and the fourth memories 336.

The first CPU 331 may use the first memories 333 and the second memories 334 as working memories. The second CPU 332 may use the third memories 335 and the fourth memories 336 as working memories. The first CPU 331 and the second CPU 332 may execute an operating system and various applications. The first CPU 331 and the second CPU 332 may control components of the body 320. For example, the first CPU 331 and the second CPU 332 may control the components of the body 320 based on PCIe.

The first CPU 331 and the second CPU 332 may access the first SSD backplane 340, the second SSD backplane 350, and the third SSD backplane 360. For example, the first CPU 331 and the second CPU 332 may access the first SSD backplane 340, the second SSD backplane 350, and the third SSD backplane 360 based on NVMe.

The first memories 333, the second memories 334, the third memories 335, and the fourth memories 336 may include DIMM memories that are inserted into DIMM slots.

The BMC 337 may be a separate system that is independent of the operating system of the first CPU 331 and the second CPU 332. The BMC 337 may collect information from the components of the electronic device 300 and may access the components. The BMC 337 may be based on a separate communication interface that is independent of a communication interface (e.g., PCIe) of the first CPU 331 and the second CPU 332. For example, the BMC 337 may be based on an intelligent platform management interface (IPMI). The communication interface of the BMC 337 may communicate with the communication interface of the first CPU 331 and the second CPU 332.

The first SSD backplane 340 may receive the power PWR from the power supply 310 and may exchange signals with the baseboard 330. The first SSD backplane 340 may exchange signals with the first CPU 331, the second CPU 332, or the BMC 337 of the baseboard 330. A plurality of SSDs may be mounted in the first SSD backplane 340. Thus, the first SSD backplane 340 may include a plurality of SSDs.

The first CPU 331 and the second CPU 332 of the baseboard 330 may access (e.g., may perform write, read, and erase operations on) the SSDs of the first SSD backplane 340. The BMC 337 of the baseboard 330 may monitor the first SSD backplane 340 and may access and control the first SSD backplane 340.

Structures and operations of the second SSD backplane 350 and the third SSD backplane 360 may be the same as the structure and the operation of the first SSD backplane 340. Thus, additional description will be omitted to avoid redundancy.

The cooling control board 370 may receive the power PWR from the power supply 310. The cooling control board 370 may control the coolers 380 under control of the baseboard 330. For example, the cooling control board 370 may control the coolers 380 under control of the first CPU 331, the second CPU 332, or the BMC 337 of the baseboard 330. The cooling control board 370 may control whether to enable and disable operations of the coolers 380 and a cooling level (or an RPM).

The coolers 380 may receive the power PWR from the power supply 310. The coolers 380 may decrease a temperature of the electronic device 300 by performing cooling under control of the cooling control board 370. The coolers 380 may include fans, etc. The coolers 380 may be disposed in one or multiple locations. For example, the coolers 380 may be distributed and disposed at two or more locations. A part of the coolers 380 may be attached on a chassis of the electronic device 300 such that external air is introduced to the inside of the electronic device 300. The others of the coolers 380 may be disposed at a specific component and may be used primarily for cooling of the specific component.

The sensors 390 may receive the power PWR from the power supply 310. The sensors 390 may be disposed adjacent to the components of the electronic device 300. Under control of the baseboard 330, the sensors 390 may collect a variety of information, and may provide the collected information to the baseboard 330.

For example, under control of the BMC 337 of the baseboard 330, the sensors 390 may collect information and may provide the collected information to the BMC 337. The sensors 390 may provide the collected information to the BMC 337 through a sensor data repository (SDR) of the IPMI. For example, different record IDs may be allocated to the sensors 390. The sensors 390 may provide information to the BMC 337, based on the different record IDs. The sensors 390 may include various sensors such as a temperature sensor, a humidity sensor, and a vibration sensor.

An example where a specific number of CPUs and a specific number of memories are mounted in the baseboard 330 is illustrated in FIG. 15, but the number of CPUs and the number of memories may be varied. A specific number of SSD backplanes are illustrated in FIG. 15, but the number of SSD backplanes may be varied. A specific kind of coolers are illustrated in FIG. 15 as much as the specific number, but the coolers may be varied in kind and number. A specific number of sensors are illustrated in FIG. 15, but sensors may be varied in kind and number.

In an example embodiment, each of the plurality of SSDs included in the first to third SSD backplanes 340, 350, and 360 may include the storage device 100 described with reference to FIGS. 1 to 13. The baseboard 330 may correspond to the host device 20 described with reference to FIGS. 1 to 13. The baseboard 330 and the SSDs of the first to third SSD backplanes 340, 350, and 360 may configure namespaces and may dynamically update the configuration of the namespaces.

Figure 16:
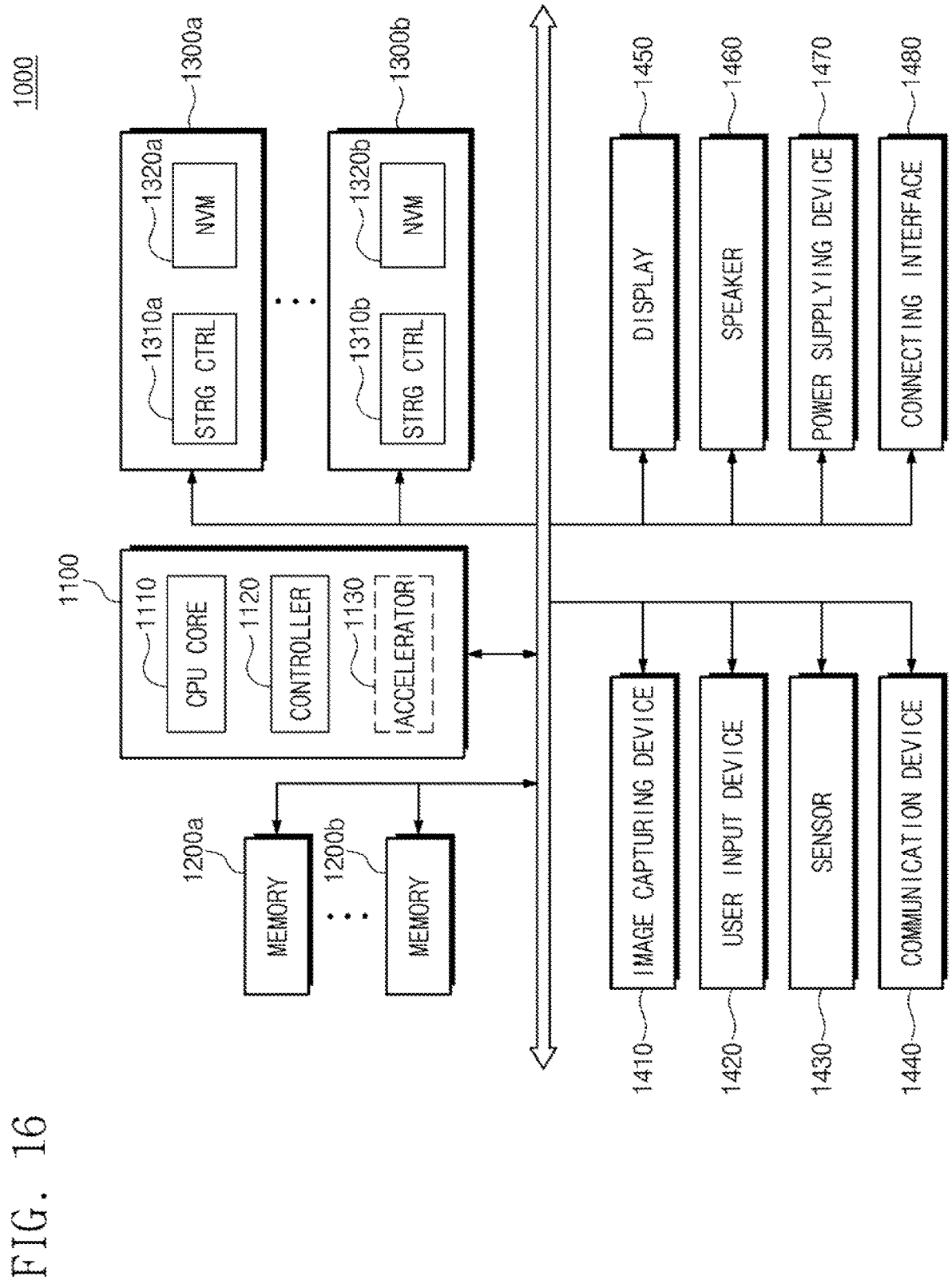
FIG. 16 is a diagram illustrating an electronic device to which a storage device according to an example embodiment is applied.

FIG. 16 is a diagram of a system 1000 to which a storage device is applied, according to an embodiment. The system 1000 of FIG. 16 may be, e.g., a mobile system, such as a portable communication terminal (e.g., a mobile phone), a smartphone, a tablet personal computer (PC), a wearable device, a healthcare device, or an Internet of things (IOT) device, or may be, e.g., a PC, a laptop computer, a server, a media player, an automotive device (e.g., a navigation device), etc.

Referring to FIG. 16, the system 1000 may include a main processor 1100, memories (e.g., 1200*a* and 1200*b*), storage devices (e.g., 1300*a* and 1300*b*), an image capturing device 1410, a user input device 1420, a sensor 1430, a communication device 1440, a display 1450, a speaker 1460, a power supplying device 1470, and a connecting interface 1480.

The main processor 1100 may control all operations of the system 1000, more specifically, operations of other components included in the system 1000. The main processor 1100 may be implemented as a general-purpose processor, a dedicated processor, or an application processor.

The main processor 1100 may include at least one CPU core 1110 and may further include a controller 1120 configured to control the memories 1200*a* and 1200*b* and/or the storage devices 1300*a* and 1300*b*.

In an example embodiment, the main processor 1100 may include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU), and be implemented as a chip that is physically separate from the other components of the main processor 1100.

The memories 1200*a* and 1200*b* may be used as main memory devices of the system 1000. Each of the memories 1200*a* and 1200*b* may include, e.g., a volatile memory, such as static random access memory (SRAM) and/or dynamic RAM (DRAM), or a non-volatile memory, such as a flash memory, phase-change RAM (PRAM) and/or resistive RAM (RRAM). The memories 1200*a* and 1200*b* may be implemented in the same package as the main processor 1100.

The storage devices 1300*a* and 1300*b* may serve as non-volatile storage devices configured to store data regardless of whether power is supplied thereto, and may have larger storage capacity than the memories 1200*a* and 1200*b*. The storage devices 1300*a* and 1300*b* may respectively include storage controllers (STRG CTRL) 1310*a* and 1310*b* and non-volatile memories (NVM) 1320*a* and 1320*b* configured to store data via the control of the storage controllers 1310*a* and 1310*b*. The NVMs 1320*a* and 1320*b* may include, e.g., flash memories having a two-dimensional (2D) structure or a three-dimensional (3D) V-NAND structure, or other types of NVMs, such as PRAM and/or RRAM.

The storage devices 1300a and 1300b may be physically separated from the main processor 1100 and included in the system 1000 or implemented in the same package as the main processor 1100. In addition, the storage devices 1300a and 1300b may have types of solid-state devices (SSDs) or memory cards and be removably combined with other components of the system 1000 through an interface, such as the connecting interface 1480 that will be described below. The storage devices 1300a and 1300b may be devices to which a standard protocol, such as a universal flash storage (UFS), an embedded multi-media card (eMMC), or a nonvolatile memory express (NVMe), is applied, for example.

The image capturing device 1410 may capture still images or moving images. The image capturing device 1410 may include a camera, a camcorder, and/or a webcam.

The user input device 1420 may receive various types of data input by a user of the system 1000 and may include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 1000 according to various communication protocols. The communication device 1440 may include an antenna, a transceiver, and/or a modem.

The display 1450 and the speaker 1460 may serve as output devices configured to respectively output visual information and auditory information to the user of the system 1000.

The power supplying device 1470 may convert power supplied from a battery (not shown) embedded in the system 1000 and/or an external power source, and supply the converted power to each of components of the system 1000.

The connecting interface 1480 may provide connection between the system 1000 and an external device, which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), system computer system interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

In an example embodiment, each of the storage controllers 1310a and 1310b may correspond to the memory controller 150 described with reference to FIGS. 1 to 13. Each of the nonvolatile memories 1320a and 1320b may correspond to the first to fourth nonvolatile memory chips 110, 120, 130, and 140 described with reference to FIGS. 1 to 13. The main processor 1100 may correspond to the host device 20 described with reference to FIGS. 1 to 13. The main processor 1100 and the storage devices 1300a and 1300b may configure namespaces and may dynamically update the namespaces.

In the above example embodiments, components according to the present disclosure may be described by using the terms "first", "second", "third", etc. However, the terms "first", "second", "third", etc. may be used to distinguish components from each other and do not limit the present disclosure. For example, the terms "first", "second", "third", etc. do not involve an order or a numerical meaning of any form.

In the above example embodiments, components may be referenced by using blocks. The blocks may be implemented with various hardware devices, such as an integrated circuit (IC), an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit, or circuits enrolled as an intellectual property (IP).

By way of summation and review, a storage device may provide a host device with information about a capacity of nonvolatile memory chips. The host device may request the storage device for a write, read, or erase operation, based on the information about the capacity of the nonvolatile memory chips. The storage device may perform the write, read, or erase operation on the nonvolatile memory chips in response to a request of the host device. The reliability of the nonvolatile memory chips may decrease as the write, read, or erase operation is repeatedly performed on the nonvolatile memory chips. The reduction in reliability of the nonvolatile memory chip may cause a fail, in which data stored in the nonvolatile memory chip is incapable of being recovered.

As described above, embodiments relate to an electronic device, and more particularly, relate to a storage device managing a storage space with improved flexibility, an operating method of the storage device, and an electronic device including the storage device. Embodiments may provide a storage device supporting a function that allows a host device to manage a storage space of the storage device more flexibly, an operating method of the storage device, and an electronic device including the storage device.

A storage device according to an example embodiment may provide information of each of nonvolatile memory chips to a host device, and may map groups provided by the host device with the nonvolatile memory chips depending on a request of the host device. The storage device may access a corresponding nonvolatile memory chip, based on an access request of the host device to a specific group. Accordingly, a storage device supporting a function that allows the host device to manage a storage space of the storage device more flexibly, an operating method of the storage device, and an electronic device including the storage device may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An operating method of a storage device that includes a plurality of nonvolatile memory chips, the method comprising:
   providing, at the storage device, information of a capacity of each of the plurality of nonvolatile memory chips to an external host device;
   receiving, at the storage device, a mode set request regarding a mapping configuration of a plurality of groups and information of the plurality of groups from the external host device;
   performing a reset responsive to receiving the mode set request and the information of the plurality of groups;
   mapping, at the storage device, the plurality of nonvolatile memory chips with the plurality of groups; and
   configuring the plurality of nonvolatile memory chips to correspond to the plurality of groups, after performing the reset.

2. The method as claimed in claim 1, wherein the information of the plurality of groups includes information in which each of the plurality of groups is mapped with at least one of the plurality of nonvolatile memory chips.

3. The method as claimed in claim 2, wherein each of the plurality of groups is a namespace defined by the external host device.

4. The method as claimed in claim 2, wherein, in response to one group of the plurality of groups being mapped with at least two nonvolatile memory chips of the plurality of nonvolatile memory chips, the storage device interleaves an access to the one group to the at least two nonvolatile memory chips.

5. The method as claimed in claim 1, further comprising:
   sending, to the external host device, an indication of whether mapping of the plurality of groups and the plurality of nonvolatile memory chips is possible, in response to receiving the information of the plurality of groups.

6. The method as claimed in claim 1, wherein the configuring includes:
   configuring a plurality of address mapping tables correlating each of the plurality of groups with at least one corresponding nonvolatile memory chip of the plurality of nonvolatile memory chips.

7. The method as claimed in claim 1, further comprising:
   outputting, to the external host device, a response providing notification that the configuring is completed.

8. The method as claimed in claim 1, wherein the mapping of the plurality of nonvolatile memory chips with the plurality of groups includes:
   receiving a request for creating the plurality of groups from the external host device; and
   mapping logical addresses of the plurality of groups with physical addresses of the plurality of nonvolatile memory chips, in response to the request for creating.

9. The method as claimed in claim 1, further comprising:
   receiving, at the storage device, information of a plurality of second groups from the external host device; and
   remapping, at the storage device, the plurality of nonvolatile memory chips with the plurality of second groups.

10. The method as claimed in claim 9, further comprising:
    detecting a fail of at least a portion of at least one nonvolatile memory chip of the plurality of nonvolatile memory chips; and
    collecting the information of the capacity of each of the plurality of nonvolatile memory chips, in response to detecting the fail of the at least a portion.

11. The method as claimed in claim 10, further comprising:
    providing the collected information of the capacity of each of the plurality of nonvolatile memory chips to the external host device,
    wherein the receiving of the information of the plurality of second groups is performed in response to the providing of the collected information of the capacity of each of the plurality of nonvolatile memory chips to the external host device.

12. The method as claimed in claim 10, wherein the information of the capacity of each of the plurality of nonvolatile memory chips indicates an available capacity except for a capacity of the at least a portion of the at least one nonvolatile memory chip in which the fail is detected, and
    wherein the information of the plurality of second groups is based on the available capacity except for the capacity of the at least a portion of the at least one nonvolatile memory chip in which the fail is detected.

13. The method as claimed in claim 9, further comprising:
    receiving, at the storage device, a delete request for the plurality of groups from the external host device; and
    releasing the mapping of the plurality of groups with the plurality of nonvolatile memory chips, in response to the delete request.

14. The method as claimed in claim 9, wherein the remapping includes allocating at least one of the plurality of nonvolatile memory chips to an over provision area.

15. The method as claimed in claim 1, further comprising:
    receiving a group identifier indicating one group of the plurality of groups and an access request from the external host device; and
    accessing at least one nonvolatile memory chip mapped with the one group from among the plurality of nonvolatile memory chips, in response to the access request.

16. A storage device, comprising:
    a plurality of nonvolatile memory chips; and
    a memory controller configured to receive a mode set request regarding a mapping configuration of a plurality of groups and information of the plurality of groups from an external host device, and responsive to receiving the mode set request map at least one nonvolatile memory chip of the plurality of nonvolatile memory chips with each of the plurality of groups,
    wherein, in response to an access request for one group of the plurality of groups being received from the external host device, the memory controller accesses at least one nonvolatile memory chip corresponding to the one group from among the plurality of nonvolatile memory chips.

17. The storage device as claimed in claim 16, wherein, in response to receiving information of a plurality of second groups from the external host device, the memory controller updates mapping between the plurality of groups and the plurality of nonvolatile memory chips with mapping between the plurality of second groups and the plurality of nonvolatile memory chips.

18. The storage device as claimed in claim 16, wherein each of the plurality of groups is a namespace defined by the external host device.

19. An electronic device, comprising:
    a central processing unit;
    a random access memory configured to be a working memory for the central processing unit; and a storage device configured to store original data of data loaded onto the random access memory by the central processing unit, and to store data generated by the central processing unit, wherein the storage device includes:

a plurality of nonvolatile memory chips; and a memory controller configured to receive a mode set request regarding a mapping configuration of a plurality of groups and information of the plurality of groups from the central processing unit, and responsive to receiving the mode set request map at least one nonvolatile memory chip of the plurality of nonvolatile memory chips with each of the plurality of groups, wherein, in response to an access request for one group of the plurality of groups being received from the central processing unit, the memory controller accesses at least one nonvolatile memory chip corresponding to the one group from among the plurality of nonvolatile memory chips, and wherein, based on a fail occurring in at least one nonvolatile memory chip of the plurality of nonvolatile memory chips, the memory controller updates mapping between the plurality of groups and the plurality of nonvolatile memory chips.

20. The electronic device as claimed in claim 19, wherein each of the plurality of groups is a namespace defined by the central processing unit.

\* \* \* \* \*